(12) United States Patent
Ren et al.

(10) Patent No.: US 11,062,874 B2
(45) Date of Patent: Jul. 13, 2021

(54) APPARATUS USING MULTIPLE CHARGED PARTICLE BEAMS

(71) Applicant: ASML Netherlands B.V., Veldhoven (NL)

(72) Inventors: Weiming Ren, San Jose, CA (US);
Xuedong Liu, San Jose, CA (US);
Xuerang Hu, San Jose, CA (US);
Zhong-wei Chen, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/474,027

(22) PCT Filed: Dec. 22, 2017

(86) PCT No.: PCT/EP2017/084429
§ 371 (c)(1),
(2) Date: Jun. 26, 2019

(87) PCT Pub. No.: WO2018/122176
PCT Pub. Date: Jul. 5, 2018

(65) Prior Publication Data
US 2019/0333732 A1    Oct. 31, 2019

Related U.S. Application Data

(60) Provisional application No. 62/440,493, filed on Dec. 30, 2016.

(51) Int. Cl.
*H01J 37/145* (2006.01)

(52) U.S. Cl.
CPC ......... *H01J 37/145* (2013.01); *H01J 2237/21* (2013.01)

(58) Field of Classification Search
USPC .................................................. 250/396 ML
See application file for complete search history.

(56) References Cited

U.S. PATENT DOCUMENTS

| 4,544,847 A * | 10/1985 | Taylor | H01J 37/141 |
| | | | 250/396 ML |
| 4,806,766 A * | 2/1989 | Chisholm | H01J 37/14 |
| | | | 250/311 |

(Continued)

FOREIGN PATENT DOCUMENTS

| EP | 0 088 457 A2 | 9/1983 |
| EP | 0 088 457 B1 | 9/1983 |

(Continued)

OTHER PUBLICATIONS

Notification of Reason(s) for Refusal issued by the Korean Patent Office in related KR Application No. 10-2019-7022327, dated Dec. 2, 2020 (10 pgs.).

(Continued)

*Primary Examiner* — Phillip A Johnston
(74) *Attorney, Agent, or Firm* — Finnegan, Henderson, Farabow, Garrett & Dunner, LLP

(57) ABSTRACT

The present disclosure proposes an anti-rotation lens and using it as an anti-rotation condenser lens in a multi-beam apparatus with a pre-beamlet-forming mechanism. The anti-rotation condenser lens keeps rotation angles of beamlets unchanged when changing currents thereof, and thereby enabling the pre-beamlet-forming mechanism to cut off electrons not in use as much as possible. In this way, the multi-beam apparatus can observe a sample with high resolution and high throughput, and is competent as a yield management tool to inspect and/or review defects on wafers/masks in semiconductor manufacturing industry.

11 Claims, 28 Drawing Sheets

(56) References Cited

U.S. PATENT DOCUMENTS

| | | | |
|---|---|---|---|
| 7,297,949 B2 | 11/2007 | Nakasuji et al. | |
| 7,560,713 B2 * | 7/2009 | Doering ................. | B82Y 10/00 |
| | | | 250/282 |
| 10,163,604 B2 * | 12/2018 | Ogasawara ............. | H01J 37/10 |
| 2003/0209674 A1 | 11/2003 | Hamaguchi et al. | |
| 2004/0135515 A1 | 7/2004 | Hamashima et al. | |
| 2013/0240750 A1 | 9/2013 | Touya et al. | |

FOREIGN PATENT DOCUMENTS

| JP | S 60-44952 A | 3/1985 |
|---|---|---|
| JP | H09-245703 A | 9/1997 |
| JP | 2003-332206 A | 11/2003 |
| JP | 2005-032588 A | 2/2005 |
| JP | 2013-093566 A | 5/2013 |
| JP | 2013-197289 A | 9/2013 |
| TW | 201351468 A | 12/2013 |
| TW | 201417134 A | 5/2014 |
| WO | WO 2001/75947 A1 | 10/2001 |
| WO | WO 2002/037527 A1 | 5/2002 |

OTHER PUBLICATIONS

Office Action issued by the Chinese Intellectual Property Office (IPO) in related Application No. 109100368, dated Oct. 12, 2020 (12 pgs.).

International Search Report and Written Opinion issued by the International Searching Authority in related PCT Application No. PCT/EP2017/084429, dated May 8, 2018 (12 pgs.).

Office Action issued by the Israeli Patent Office in related Application No. 267670, dated Jul. 2, 2020 (2 pgs.).

Office Action issued by the Japanese Patent Office in related Application No. JP 2019-530771, dated Jun. 11, 2020 (9 pgs.).

* cited by examiner

APPARATUS USING MULTIPLE CHARGED PARTICLE BEAMS

CROSS-REFERENCE TO RELATED APPLICATIONS

This application is a national stage filing under 35 U.S.C. § 371 of International Application No. PCT/EP2017/084429, filed on Dec. 22, 2017, and published as WO 2018/122176 A1, which claims priority of U.S. application 62/440,493 which was filed on Dec. 30, 2016. These applications are incorporated herein by reference in their entireties.

TECHNICAL FIELD

The embodiments provided herein disclose a charged particle apparatus with multiple charged particle beams, and more particularly, an apparatus utilizing multiple charged particle beams to observe or inspect a sample.

BACKGROUND

When manufacturing semiconductor IC chips, pattern defects and/or uninvited particles (residuals) inevitably appear on a wafer and/or a mask during fabrication processes, thereby reducing the yield to a great degree. For example, uninvited particles are very troublesome for patterns with smaller critical feature dimensions, which have been adopted to meet the more and more advanced requirements on performance of IC chips. Accordingly, the conventional yield management tools with optical beam gradually become incompetent due to diffraction effect, and yield management tools with electron beam are employed more often as an electron beam (when compared to a photon beam) has a shorter wavelength and thereby can offer superior spatial resolution.

Currently, the yield management tools with electron beams employ the principle of scanning electron microscope (SEM) with a single electron beam, which therefore can provide higher resolution but cannot provide throughputs competent for mass production. Although a higher current of single electron beam can be used to increase the throughputs, the superior spatial resolutions will be fundamentally deteriorated by the Coulomb Effect that increases with the beam current.

To break through the limit of throughput, instead of using a single electron beam with a large current, one solution is to use a plurality of electron beams, each with a small current. The plurality of electron beams forms a plurality of probe spots on a surface of a sample that is under observation or inspection. The plurality of probe spots can simultaneously scan a plurality of small scanned regions within a large observed area on the sample surface. The electrons of each probe spot generate secondary electrons from the sample surface where they land on, and the secondary electrons form a secondary electron beam.

Secondary electrons comprise slow secondary electrons (energies ≥50 eV) and backscattered electrons (energies close to landing energies of the electrons). The secondary electron beams from the plurality of small scanned regions can be simultaneously collected by a plurality of electron detectors. As a result, an image of the large observed area including all of the small scanned regions can be obtained much faster than scanning with a single beam.

The plurality of electron beams can be obtained either from a plurality of electron sources, or from a single electron source. For the former, the plurality of electron beams is usually focused onto and scans the plurality of small scanned regions within a plurality of columns respectively, and the secondary electrons from each scanned region are detected by one electron detector inside the corresponding column. The apparatus therefore is generally called as a multi-column apparatus. On the sample surface, the beam interval or pitch is at the order of several to a few tens of mm.

For the latter, a source-conversion unit virtually forms a plurality of sub-sources from the single electron source. The source-conversion unit comprises a beamlet-limit (or beamlet-forming) mechanism with a plurality of beam-limit openings and an image-forming mechanism with a plurality of electron optics elements. A primary-electron beam generated by the single electron source is divided into a plurality of sub-beams or beamlets by the plurality of beam-limit openings, and the plurality of electron optics elements influence the plurality of beamlets to form a plurality of parallel (virtual or real) images of the single electron source. Each image can be taken as one sub-source that emits one corresponding beamlet. To make more beamlets available for obtaining higher throughput, the beamlet intervals in the source-conversion unit are configured as small as possible, and typically are at a micro-meter level.

Within a single column, a primary projection imaging system can be used to project the plurality of parallel images onto the sample surface and form a plurality of probe spots thereon. A common deflection scanning unit can be used to deflect the plurality of beamlets to scan the plurality of probe spots over a plurality of small scanned regions, where each probe spot formed by one beamlet scans over a respective small scanned region. The secondary electron beams generated from the plurality of small scanned regions are directed by a beam separator into a secondary projection imaging system, and then focused by the secondary projection imaging system to be detected by a plurality of detection elements of an electron detection device, where each secondary electron beam generated from one small scanned region is detected by one detection element of the electron detection device. The plurality of detection elements can be a plurality of electron detectors placed side by side or a plurality of pixels of one electron detector. The apparatus therefore is generally called a multi-beam apparatus.

The beamlet-limit mechanism is usually an electric-conduction plate with a plurality of through-holes, and the plurality of through-holes constitutes the plurality of beam-limit openings. For the image-forming mechanism, each electron optics element can be an electrostatic micro-lens that focuses one beamlet to form one of the plurality of parallel real images, or an electrostatic micro-deflector that deflects one beamlet to form one of the plurality of parallel virtual images. The Coulomb Effect is weaker in one virtual image than in one real image due to the higher current density associated with the real image.

To reduce the Coulomb Effect in the space above the source-conversion unit, a pre-beamlet-forming mechanism with multiple beamlet-forming apertures can be placed close to the single electron source to trim the primary-electron beam as early as possible. Most of the electrons that are in the primary-electron beam but not used to form the plurality of probe spots cannot pass through the multiple beamlet-forming apertures. Currents of the plurality of probe spots can be changed by adjusting a focusing power of a condenser lens between the single electron source and the source-conversion unit. Usually the condenser lens is a magnetic lens, and the plurality of beamlets rotates around an optical axis of the condenser lens. The rotation angle changes with the focusing power. The rotation angle variation may introduce a mismatch of the plurality of beamlets between the pre-beamlet-forming mechanism and the beamlet-limit mechanism, thereby increasing differences among currents of the plurality of probe spots. The current differences deteriorate throughput for observation or inspection of the sample.

SUMMARY

The embodiments of the present disclosure provide a multi-beam apparatus with high resolution and high throughput for observing or inspecting a sample in varying imaging conditions (e.g., currents of probe spots and landing energies of beamlets). The embodiments use a pre-beamlet-forming mechanism and an anti-rotation condenser lens or a movable anti-rotation condenser lens to reduce the Coulomb Effect, thereby improving the spatial resolutions of images of the sample. The condenser lens can keep current uniformity of the plurality of probe spots when currents thereof are changed. As a result, the multi-beam apparatus is competent as a yield management tool to inspect and/or review defects on wafers/masks in semiconductor manufacturing industry.

In some embodiments, an anti-rotation lens having a focusing power for focusing a charged particle beam is provided. The anti-rotation lens includes a first magnetic lens configured to generate a first magnetic field and to be aligned with an optical axis of the anti-rotation lens. The anti-rotation lens also includes a second magnetic lens configured to generate a second magnetic field and to be aligned with the optical axis. The focusing power of the anti-rotation lens is adjustable by varying the first magnetic field and the second magnetic field, and the first magnetic field and the second magnetic field have opposite directions on the optical axis.

In some embodiments, an anti-rotation lens having a focusing power for focusing a charged particle beam is provided. The anti-rotation lens includes a magnetic lens configured to generate a magnetic field and to be aligned with an optical axis of the anti-rotation lens. The anti-rotation lens also includes an electrostatic lens configured to generate an electrostatic field and to be aligned with the optical axis. The magnetic field and the electrostatic field at least partially overlap, and the focusing power of the anti-rotation lens is adjustable by varying the magnetic field and/or the electrostatic field.

In some embodiments, a movable anti-rotation lens having a focusing power for focusing a charged particle beam is provided. The moveable anti-rotation lens includes a first magnetic lens configured to generate a first magnetic field and to be aligned with an optical axis of the movable anti-rotation lens. The moveable anti-rotation lens also includes a second magnetic lens configured to generate a second magnetic field and to be aligned with the optical axis. The moveable anti-rotation lens also includes a third magnetic lens configured to generate a third magnetic field and to be aligned with the optical axis. The focusing power and a principal plane of the movable anti-rotation lens are adjustable by varying the first magnetic field, the second magnetic field, and/or the third magnetic field, and two of the first magnetic field, the second magnetic field, and the third magnetic field have opposite directions on the optical axis.

In some embodiments, a movable anti-rotation lens having a focusing power for focusing a charged particle beam is disclosed. The movable anti-rotation lens includes an anti-rotation lens configured to be aligned with an optical axis of the movable anti-rotation lens. The moveable anti-rotation lens also includes a lens configured to be aligned with the optical axis. The focusing power and a principal plane of the movable anti-rotation lens are adjustable by varying a focusing power of the anti-rotation lens and/or a focusing power of the lens and wherein the principal plane is adjustable with respect to a source generating the charged particle beam.

In some embodiments, a movable anti-rotation lens having a focusing power for focusing a charged particle beam is disclosed. The movable anti-rotation lens includes a first anti-rotation lens configured to be aligned with an optical axis of the movable anti-rotation lens. The moveable anti-rotation lens also includes a second anti-rotation lens configured to be aligned with the optical axis. The focusing power and a principal plane of the movable anti-rotation lens are adjustable by varying a focusing power of the first anti-rotation lens and/or a focusing power of the second anti-rotation lens.

In some embodiments, a multi-beam apparatus for observing a sample is disclosed. The multi-beam apparatus includes an electron source configured to generate a primary-electron beam and a condenser lens configured to focus the primary-electron beam and be one of an anti-rotation lens or a movable anti-rotation lens. The multi-beam apparatus further includes a source-conversion unit configured to form a plurality of images of the electron source by a plurality of beamlets of the primary-electron beam, an objective lens configured to focus the plurality of beamlets onto the surface and form a plurality of probe spots thereon, and an electron detection device with a plurality of detection elements configured to detect a plurality of secondary beams generated by the plurality of probe spots from the sample. The multi-beam apparatus can further include a pre-beamlet-forming mechanism that is between the electron source and the condenser lens and includes multiple beamlet-forming apertures. The condenser lens is used to keep rotation angles of the plurality of beamlets unchanged or substantially unchanged when changing probe currents of the plurality of probe spots.

In some embodiments, a method to configure an anti-rotation lens for focusing a charge particle beam is provided. The method includes generating a first magnetic field by a first magnetic lens that is aligned with an optical axis of the anti-rotation lens. The method also includes generating a second magnetic field by a second magnetic lens this is aligned with the optical axis. The method further includes generating a focusing power of the anti-rotation lens by the first magnetic field and the second magnetic field. The first magnetic field and the second magnetic field have opposite directions on the optical axis.

In some embodiments, a method to configure an anti-rotation lens for focusing a charge particle beam is provided. The method includes generating a magnetic field by a magnetic lens and generating an electrostatic field by an electrostatic lens. The method further includes generating a focusing power of the anti-rotation lens by the magnetic field and/or the electrostatic field, wherein the magnetic field and the electrostatic field at least partially overlap.

In some embodiments, a method to configure a moveable anti-rotation lens for focusing a charge particle beam is provided. The method includes generating a first magnetic field by a first magnetic lens that is aligned with an optical axis of the movable anti-rotation lens, generating a second magnetic field by a second magnetic lens that is aligned with the optical axis, and generating a third magnetic field by a third magnetic lens that is aligned with the optical axis. The method further includes generating a focusing power of the movable anti-rotation lens by the first magnetic field, the second magnetic field, and/or the third magnetic field, wherein two of the first magnetic field, the second magnetic field, and the third magnetic field have opposite directions on the optical axis.

In some embodiments, a method to configure a multi-beam apparatus for observing a sample is provided. The method includes trimming a primary-electron beam from an electron source into multiple beamlets by a pre-beamlet forming mechanism that is positioned between the electron source and a condenser lens and forming a plurality of images of the electron source using the multiple beamlets by a source-conversion unit. The method further includes forming a plurality of probe spots on the sample by projecting the plurality of images onto the sample and adjusting the condenser lens to keep rotation angles of the multiple beamlets unchanged or substantially unchanged when changing probe currents of the plurality of probe spots, wherein the condenser lens is one of an anti-rotation lens or a movable anti-rotation lens.

In some embodiments, a non-transitory computer readable medium is provided. The non-transitory computer readable medium stores a set of instructions that is executable by one or more processors of a multi-beam apparatus to cause the multi-beam apparatus to perform a method to configure an anti-rotation lens for focusing a charge particle beam. The method includes instructing a first magnetic lens to generate a first magnetic field, wherein the first magnetic lens is aligned with an optical axis of the anti-rotation lens and instructing a second magnetic lens to generate a second magnetic field, wherein the second magnetic lens is aligned with the optical axis. The first magnetic field and the second magnetic field generate a focusing power of the anti-rotation lens and have opposite directions on the optical axis.

In some embodiments, a non-transitory computer readable medium is provided. The non-transitory computer readable medium stores a set of instructions that is executable by one or more processors of a multi-beam apparatus to cause the multi-beam apparatus to perform a method to configure an anti-rotation lens for focusing a charge particle beam. The method includes instructing a magnetic lens to generate a magnetic field and instructing an electrostatic lens to generate an electrostatic field. The magnetic field and/or electrostatic field generate a focusing power of the anti-rotation lens. Moreover, the magnetic field and the electrostatic field at least partially overlap.

In some embodiments, a non-transitory computer readable medium is provided. The non-transitory computer readable medium stores a set of instructions that is executable by one or more processors of a multi-beam apparatus to cause the multi-beam apparatus to perform a method to configure a movable anti-rotation lens for focusing a charge particle beam. The method includes instructing a first magnetic lens to generate a first magnetic field, wherein the first magnetic lens is aligned with an optical axis of the movable anti-rotation lens; instructing a second magnetic lens to generate a second magnetic field, wherein the second magnetic lens is aligned with the optical axis; and instructing a third magnetic lens to generate a third magnetic field, wherein the third magnetic lens that is aligned with the optical axis. The first magnetic field, the second magnetic field, and/or the third magnetic field generate a focusing power of the movable anti-rotation lens. Moreover, two of the first magnetic field, the second magnetic field, and the third magnetic field have opposite directions on the optical axis.

Other advantages of the present invention will become apparent from the following description taken in conjunction with the accompanying drawings wherein are set forth, by way of illustration and example, certain embodiments of the present invention.

DETAILED DESCRIPTION

Figure 1A:
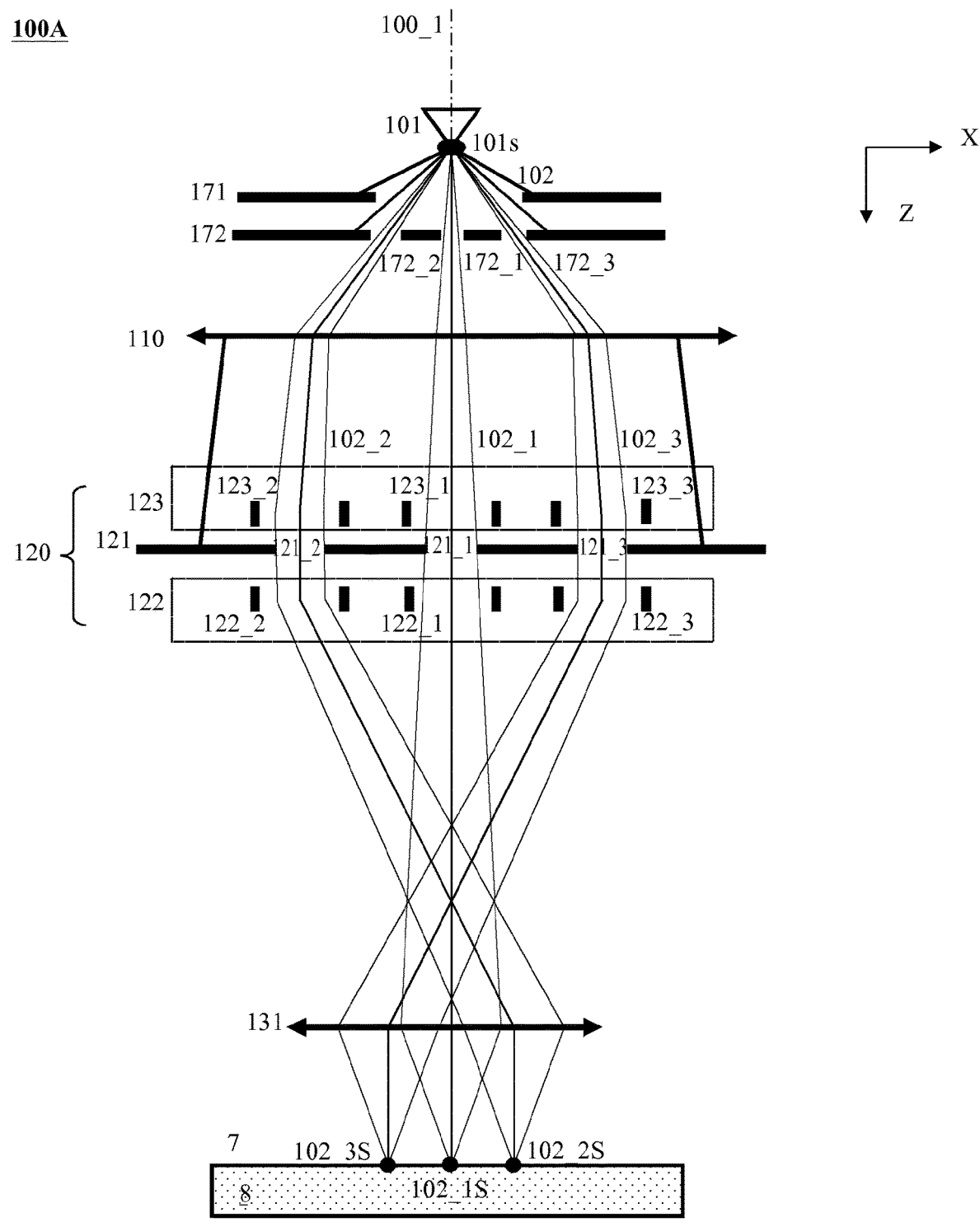
FIGS. 1A and 1B are schematic diagrams each illustrating an exemplary configuration of a multi-beam apparatus.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

Relative dimensions of components in drawings may be exaggerated for clarity. Within the following description of drawings the same or like reference numbers refer to the same or like components or entities, and only the differences with respect to the individual embodiments are described.

Without limiting the scope of the protection, all the description and drawings of the embodiments will exemplarily be referred to as an electron beam. However, the embodiments are not used to limit the disclosed embodiments to specific charged particles.

The embodiments of the present application relate to a multi-beam apparatus or a charged particle apparatus with a plurality of charged particle beams. More particularly, they relate to an apparatus that employs plural charged particle beams to simultaneously acquire images of plural scanned regions of an observed area on a sample surface. The apparatus can be used to inspect and/or review defects on wafers/masks with high resolution and high throughput in semiconductor manufacturing industry.

Further, the embodiments of the present application relate to a pre-beamlet-forming mechanism and an anti-rotation condenser lens or a movable anti-rotation condenser lens to reduce the Coulomb Effect in the multi-beam apparatus, and therefore improve spatial resolution of images of the multiple small scanned regions of the sample under observation or inspection. In the multi-beam apparatus, the pre-beamlet-forming mechanism having multiple beamlet-forming apertures trims a primary-electron beam from a single electron source into multiple beamlets. The anti-rotation condenser lens or a movable anti-rotation condenser lens focuses the multiple beamlet to be incident onto a source-conversion unit, and the source-conversion unit forms multiple parallel images of the single electron source by the multiple beamlets. The parallel images are projected (via an objective lens) onto a sample surface and form multiple probe spots thereon. The multiple beamlets can be deflected to scan the multiple probe spots over the small scanned regions respectively by at least one of a deflection scanning unit and the source-conversion unit. The currents of the probe spots can be limited by the source-conversion unit and be varied by adjusting the anti-rotation condenser lens, or can be limited by the pre-beamlet-forming mechanism and be varied by changing sizes of the beamlet-forming apertures. The source-conversion unit can reduce the sizes of the probe spots and the size differences between the probe spots by compensating off-axis aberrations thereof.

Moreover, the disclosed embodiments provide configurations of the pre-beamlet-forming mechanism, the anti-rotation condenser lens, the movable anti-rotation condenser lens, and the corresponding multi-beam apparatus. For purpose of illustration, three beamlets are shown in most embodiments, but the actual number of beamlets can be arbitrary. Deflection scanning unit, beam separator, secondary projection imaging system, electron detection device, and a combination of any of them can be incorporated into the multi-beam apparatus and are not shown or sometimes mentioned in the description of the embodiments.

In accordance with embodiments of the present disclosure, X, Y and Z axes are Cartesian coordinate. A primary optical axis of multi-beam apparatus is on the Z-axis and the primary-electron beam from the single electron source travels along the Z-axis.

When an electron beam pass through a magnetic lens with an optical axis on the Z-axis, the focusing power 1/f of a magnetic lens and a rotation angle θ of the electron beam around the optical axis are determined by the magnetic field thereof, and can be calculated by Equations (1) and (2).

$$\frac{1}{f} = \frac{e}{8mV} \int_{z1}^{z2} B^2(z) \cdot dz \qquad (1)$$

$$\theta = \sqrt{\frac{e}{8mV}} \int_{z1}^{z2} B(z) \cdot dz \qquad (2)$$

Here, variables e, m and V are the charge, mass, and energy of the electron; B(z) is the magnetic field on the Z-axis; and z1 and z2 are the starting and ending positions of the electron beam along the Z-axis. Therefore, the rotation angle θ basically changes with the focusing power 1/f of the magnetic lens. According to equations (1) and (2), the rotation angle θ is related to the polarity of the on-axis magnetic field B(z), but the focusing power 1/f is not. Therefore, if the polarity is not same along the Z-axis, the focusing power 1/f can be changed without influencing the rotation angle, and the corresponding lens is an anti-rotation lens (ARL).

Reference is now made to FIG. 1A, which is a schematic diagram illustrating an exemplary configuration of a conventional multi-beam apparatus 100A. Multi-beam apparatus 100A comprises an electron source 101, a pre-beamlet-forming mechanism 172, a condenser lens 110, a source-conversion unit 120, and an objective lens 131. Beamlet-forming apertures 172_1, 172_2, and 172_3 of pre-beamlet-forming mechanism 172 trims a primary-electron beam 102 generated by electron source 101 into three beamlets 102_1, 102_2, and 102_3 (wherein 102_2 and 102_3 are off-axis beamlets that are not on primary optical axis 100_1 of apparatus 100A) in a place close to electron source 101 and far above source-conversion unit 120. Condenser lens 110 focuses three beamlets 102_1~102_3 to be incident onto the source-conversion unit 120. Source-conversion unit 120 comprises one pre-beamlet-bending mechanism 123 with three pre-bending micro-deflectors 123_1, 123_2 and 123_3, one beamlet-limit mechanism 121 with three beam-limit openings 121_1~121_3, and one image-forming mechanism 122 with three image-forming micro-deflectors 122-1_1, 122-1_2 and 122-1_3. Three pre-bending micro-deflectors 123_1~123_3 respectively deflect three beamlets 102_1~102_3 perpendicularly incident onto three beam-limit openings 121_1~121_3. Beam-limit openings 121_1, 121_2, and 121_3 cut off residual peripheral electrons of three beamlets 102_1~102_3 and therefore limit currents thereof. Three image-forming micro-deflectors 122-1_1-122~1_3 deflect three beamlets 102_1~102_3 towards primary optical axis 100_1 and form three virtual images of electron source 101. Objective lens 131 focuses three deflected beamlets 102_1~102_3 onto a surface 7 of a sample 8, i.e. projecting the three virtual images onto surface 7. The three images formed by three beamlets 102_1~102_3 on surface 7 form three probe spots 102_1S, 102_2S and 102_3S thereon. The deflection angles of beamlets 102_1~102_3 due to image-forming micro-deflectors 122-1_1~122-1_3 are adjusted to reduce the off-axis aberrations of three probe spots 102_1S~102_3S due to objective lens 131, and the three deflected beamlets consequently pass through or approach the front focal point of objective lens 131.

The currents can be varied by adjusting the focusing power of condenser lens 110. However, positions of beamlets 102_1~102_3 change with respect to beam-limit openings 121_1~121_3 when the currents are changed. Hence a mismatch of one beamlet coming from a beamlet-forming aperture with its corresponding beam-limit opening may occur. Condenser lens 110 can be configured to be electrostatic, magnetic, or electromagnetic compound lens. Magnetic condenser lens has smaller aberrations when compared to electrostatic lens. For an electrostatic condenser lens, the mismatch is only along a radial direction, which is a direction perpendicular to primary optical axis 100_1, as shown in FIG. 2C. For a magnetic or electromagnetic compound lends, because the rotation angles of beamlets 102_1~102_3 change, the mismatch is along both a radial direction and a rotation direction as shown in FIG. 2E.

In some embodiment, condenser lens 110 is configured to be magnetic, which can result in off-axis beamlets 102_2 and 102_3 passing through pre-beamlet-forming mechanism 172 land on beamlet-limit mechanism 121 with rotation angles. The rotation angles change with the focusing power of condenser lens 110. Full fill-in of beamlets 102_2 and 102_3 in beam-limit openings 121_2 and 121_3 can be achieved by enlarging the sizes of beamlet-forming apertures 172_2 and 172_3. Enlarging the sizes of beamlet-forming apertures can introduce more electrons not in use, and therefore increase the Coulomb Effect in space between pre-beamlet-forming mechanism 172 and source-conversion unit 120. Spatial resolutions of the images of the small scanned regions deteriorate. Full fill-in of beamlets 102_2 and 102_3 in beam-limit openings 121_2 and 121_3 can also be achieved by keeping the rotation angles unchanged or substantially unchanged when the focusing power of condenser lens 110 changes. This solution uses an anti-rotation lens as condenser lens 110.

Figure 1B:
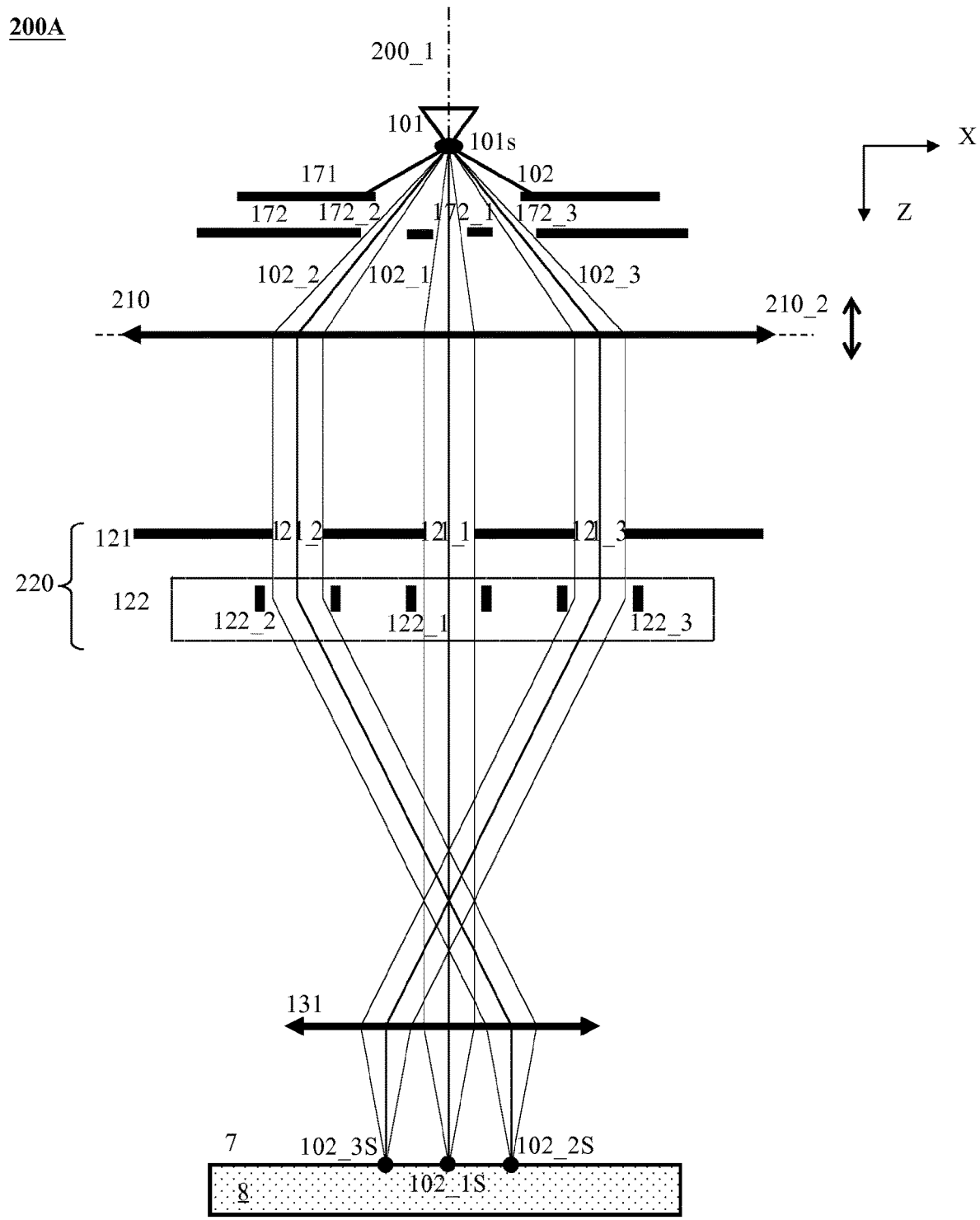

Reference is now made to FIG. 1B, which is a schematic diagram illustrating another exemplary configuration of a multi-beam apparatus 200A. Multi-beam apparatus 200A comprises an electron source 101, a pre-beamlet-forming mechanism 172, a movable condenser lens 210, a source-conversion unit 220, and an objective lens 131. Primary-electron beam 102 generated by electron source 101 is trimmed into three beamlets 102_1, 102_2 and 102_3 by three beamlet-forming apertures 172_1, 172_2 and 172_3 of pre-beamlet-forming mechanism 172. Movable condenser lens 210 focuses three beamlets 102_1~102_3 to be perpendicularly incident onto source-conversion unit 220. Source-conversion unit 220 comprises one beamlet-limit mechanism 121 with three beam-limit openings 121_1~121_3 and one image-forming mechanism 122-1 with three image-forming micro-deflectors 122-1_1, 122-1_2 and 122-1_3. Beam-limit openings 121_1, 121_2, and 121_3 cut off residual peripheral electrons of three beamlets 102_1~102_3 and therefore limit currents thereof. Three image-forming micro-deflectors 122-1_1~122-1_3 deflect three beamlets 102_1~102_3 towards primary optical axis 200_1 and form three virtual images of electron source 101. Objective lens 131 focuses three deflected beamlets 102_1~102_3 onto a surface 7 of a sample 8, i.e. projecting the three virtual images onto surface 7. The three images formed by three beamlets 102_1~102_3 on surface 7 form three probe spots 102_1S, 102_2S and 102_3S thereon. The deflection angles of beamlets 102_1~102_3 due to image-forming micro-deflectors 122-1_1~122-1_3 are adjusted to reduce the off-axis aberrations of three probe spots 102_1S~102_3S due to objective lens 131, and the three deflected beamlets consequently pass through or approach the front focal point of objective lens 131.

Movable condenser lens 210 is configured so that the position of its first principle plane 210_2 is movable. Currents of beamlet 102_1~102_3 can be varied by adjusting both the focusing power and the position of first principal plane 210_2 of movable condenser lens 210 while keeping beamlets 102_1~102_3 to be perpendicularly incident onto source-conversion unit 120. However, positions of beamlets 102_1~102_3 change with respect to beam-limit openings 121_1~121_3 when the currents are changed. A mismatch of one beamlet coming from a beamlet-forming aperture and its corresponding beam-limit opening may occur. Movable condenser lens 210 can be configured to be electrostatic, magnetic, or electromagnetic compound lens. As mentioned above, the mismatch is only along a radial direction (perpendicular to primary optical axis 200_1) for an electrostatic condenser lens, or along both a radial direction and a rotation direction for a magnetic or electromagnetic compound condenser lens.

In some embodiments, movable condenser lens 210 is configured to be magnetic, which can result in off-axis beamlets 102_2 and 102_3 passing through pre-beamlet-forming mechanism 172 and landing on beamlet-limit mechanism 121 with rotation angles. The rotation angles change with the focusing power and the position of the first principal plane of movable condenser lens 210. Full fill-in of beamlets 102_2 and 102_3 in beam-limit openings 121_2 and 121_3 can be achieved by enlarging the sizes of beamlet-forming apertures 172_2 and 172_3. Enlarging the sizes of beamlet-forming apertures can introduce more electrons not in use and therefore increase the Coulomb Effect in space between pre-beamlet-forming mechanism 172 and source-conversion unit 120. Spatial resolutions of the images of the small scanned regions therefore deteriorate. Full fill-in of beamlets 102_2 and 102_3 in beam-limit openings 121_2 and 121_3 can also be achieved by keeping the rotation angles unchanged when the focusing power and the position of the first principal plane of movable condenser lens 210 are changed. This solution uses an anti-rotation lens with a movable first principal plane, i.e. a movable anti-rotation lens (MARL), as movable condenser lens 210.

Figure 2A:
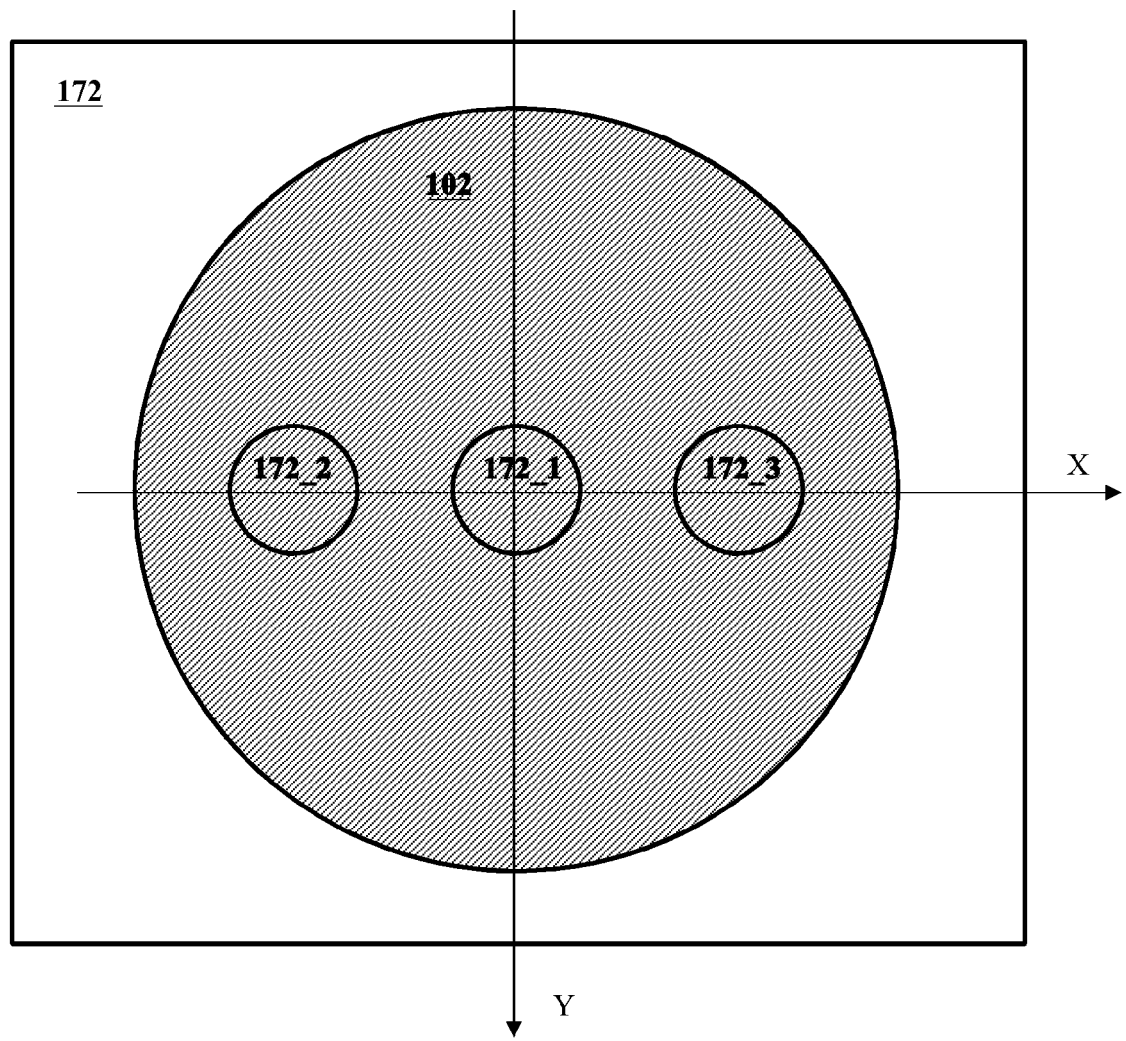
FIG. 2A is a cross sectional diagram at X-Y plane of pre-beamlet-forming mechanism of FIGS. 1A and 1B, illustrating exemplary spots of a primary-electron beam and three beamlets.
Figure 2B:
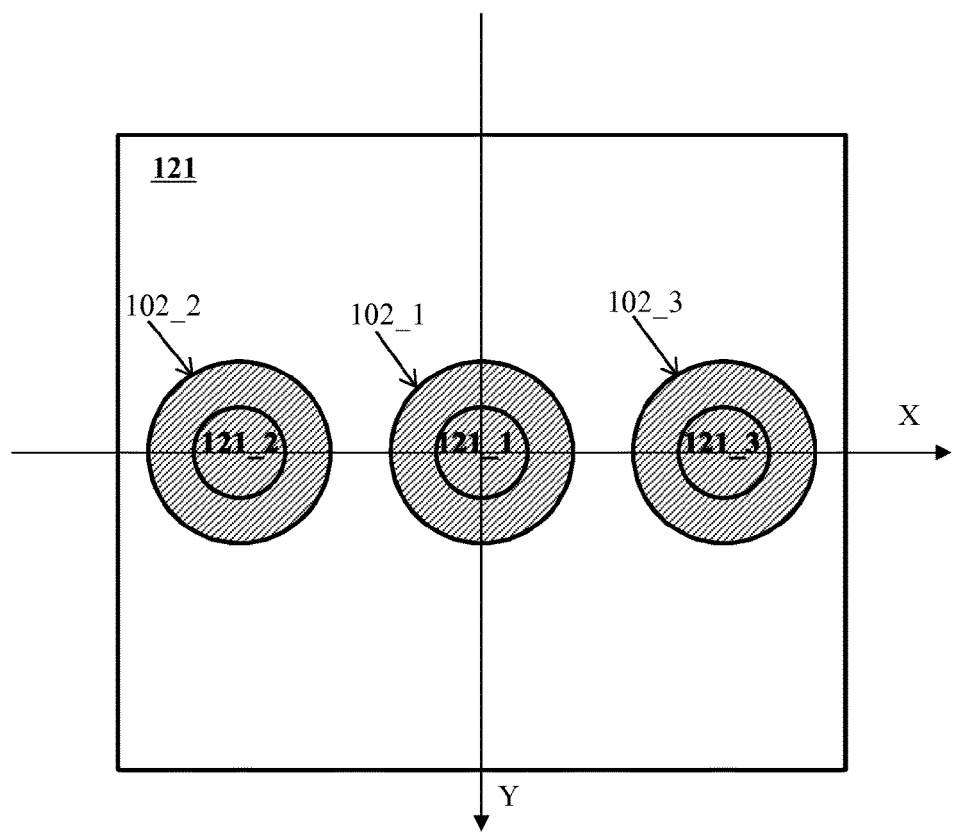
FIGS. 2B, 2C, 2D, and 2E are cross sectional diagrams at X-Y plane of beamlet-limit mechanism of FIGS. 1A and 1B, each illustrating exemplary spots of three beamlets and three beam-limit openings.
Figure 2C:
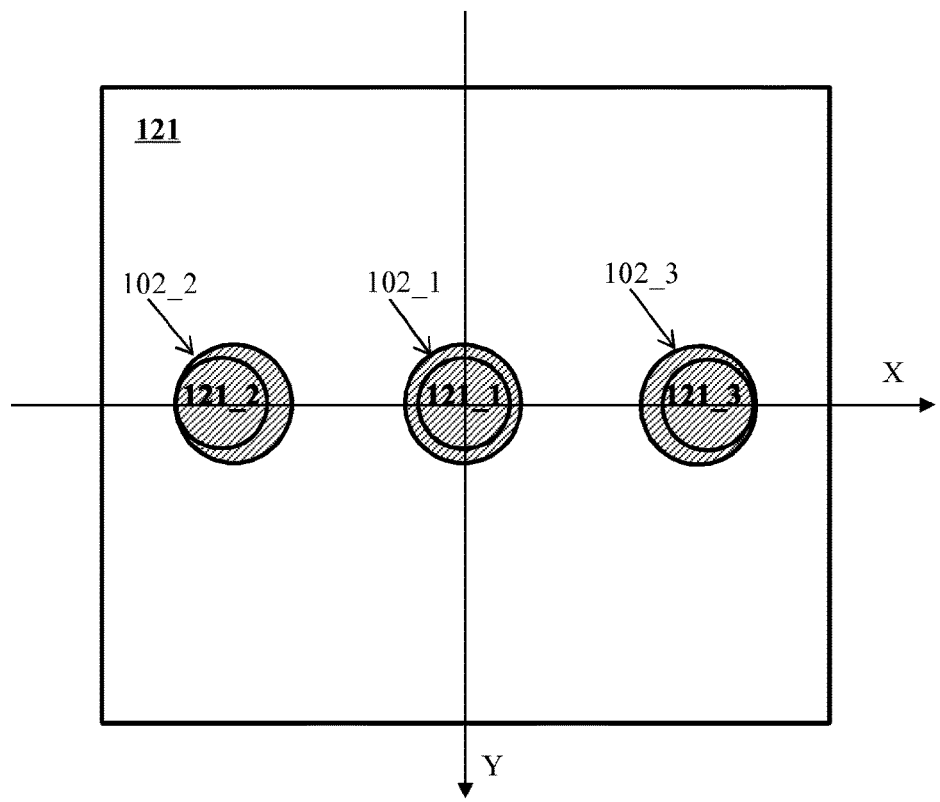
Figure 2D:
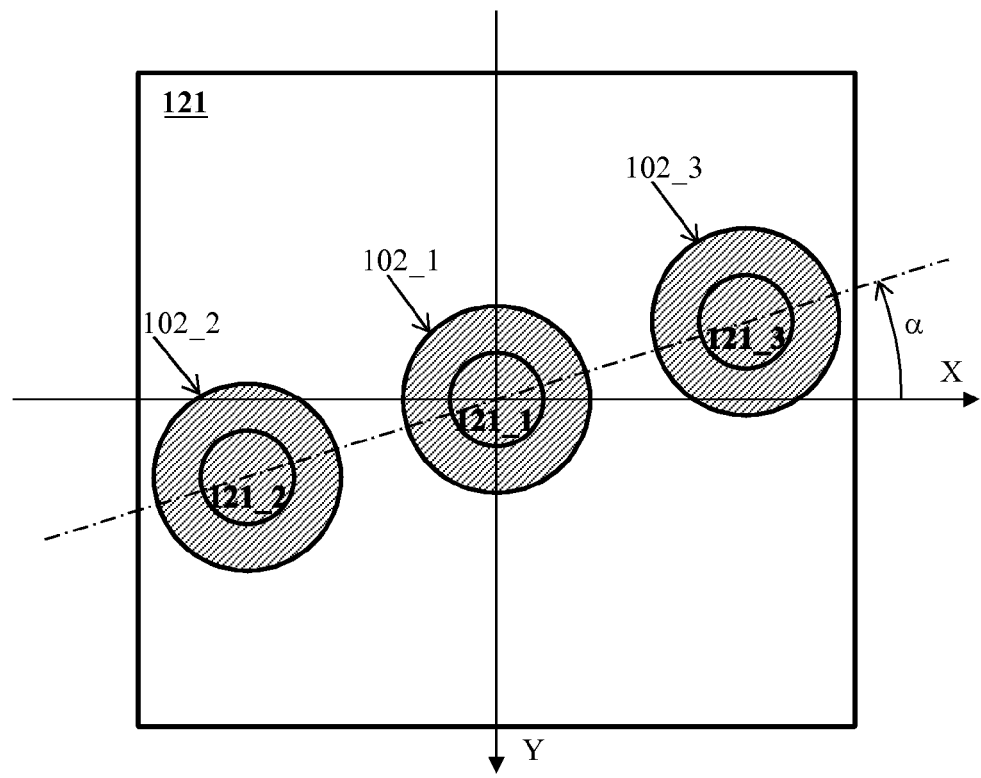
Figure 2E:
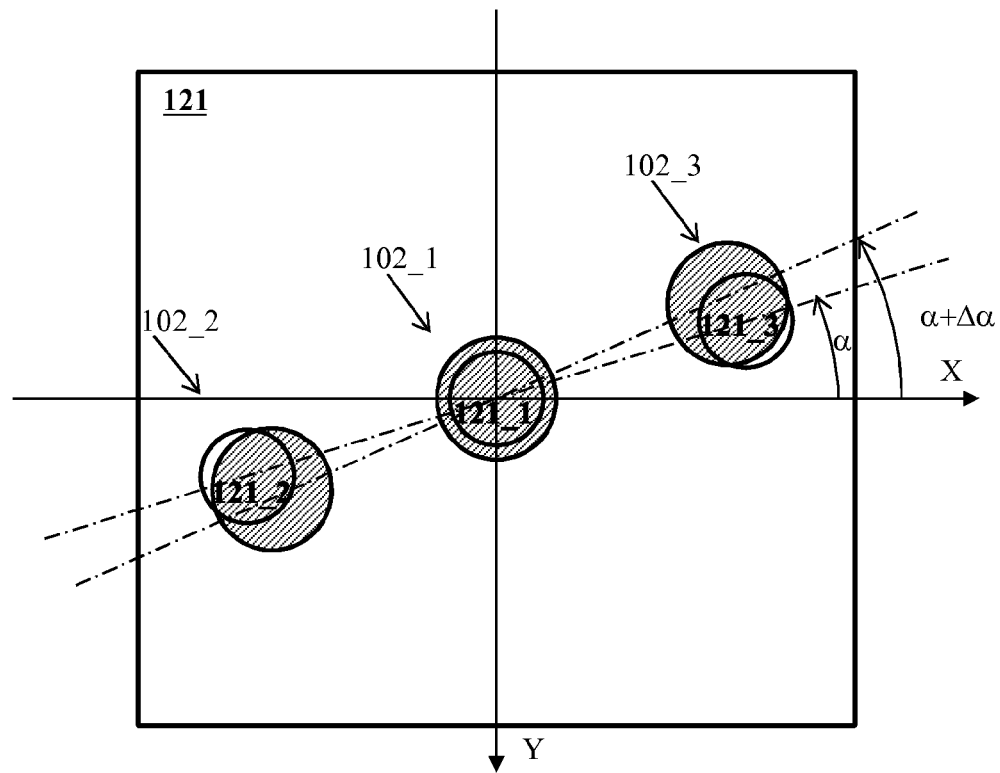

Reference is now made to FIGS. 2A-2E. FIG. 2A is a cross sectional diagram at X-Y plane of pre-beamlet-forming mechanism 172 of FIGS. 1A and 1B, illustrating exemplary spots of a primary-electron beam and three beamlets. FIGS. 2B-2E are respectively a cross sectional diagram at X-Y plane of beamlet-limit mechanism 121 of FIGS. 1A and 1B, illustrating exemplary spots of three beamlets and three beam-limit openings.

In FIG. 2A, primary-electron beam 102 illuminates pre-beamlet-forming mechanism 172, wherein beamlet-forming apertures 172_1~172_3 are arranged along the X-axis. If condenser lens 110 in FIG. 1A or movable condenser lens 210 in FIG. 1B is electrostatic, beamlets 102_1~102_3 can be incident onto beamlet-limit mechanism 121 along the X-axis, as shown in FIG. 2B and FIG. 2C. Three beamlet 102_1~102_3 are focused more strongly in FIG. 2C than in FIG. 2B. Accordingly, the currents of three beamlet 102_1~102_3 are larger in FIG. 2C than in FIG. 2B. If condenser lens 110 in FIG. 1A or the movable condenser lens 210 in FIG. 1B is magnetic or electromagnetic compound, beamlets 102_1~102_3 are incident onto beamlet-limit mechanism 121 with a rotation angle around the optical axis of the corresponding condenser lens, as shown in FIG. 2D and FIG. 2E. Beamlets 102_1~102_3 are focused more strongly in FIG. 2E than in FIG. 2D. Accordingly, beamlets 102_1~102_3 are incident onto beamlet-limit mechanism 121 with larger currents and larger rotation angles in FIG. 2E than in FIG. 2D. In FIG. 2E, two edge beamlets 102_2 and 102_3 rotate partially away from beam-limit openings 121_2 and 121_3, and their currents after passing through beam-limit openings 121_2 and 121_3 can be different from the current of center beamlet 102_1 if beam-limit openings 121_1~121_3 have the same radial sizes.

An anti-rotation lens has a focusing power that can be changed without influencing a rotation angle of an electron beam passing through. If the condenser lens 110 in FIG. 1A is an anti-rotation lens, the mismatch in FIG. 2E can be eliminated. The anti-rotation lens can be formed by two magnetic lenses, or by one magnetic lens and one electrostatic lens. For an electron beam, by appropriately adjusting the excitations of the lenses inside the anti-rotation lens, the focusing power thereof can be varied without affecting the rotation angle of the electron beam.

Figure 3A:
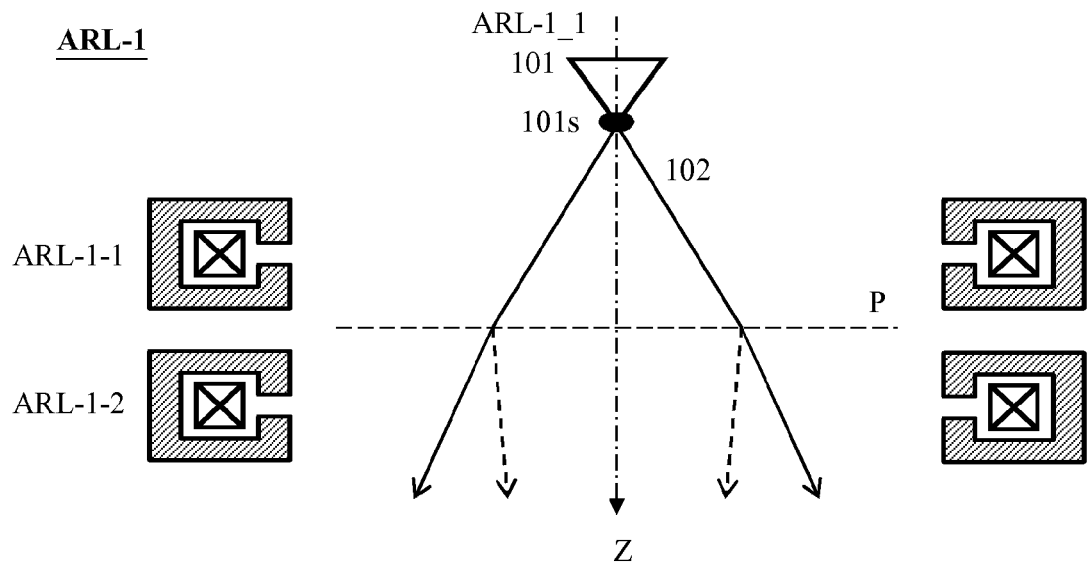
FIGS. 3A and 3B are schematic diagrams each illustrating an exemplary configuration of anti-rotation lens, consistent with embodiments of the present disclosure.
Figure 3B:
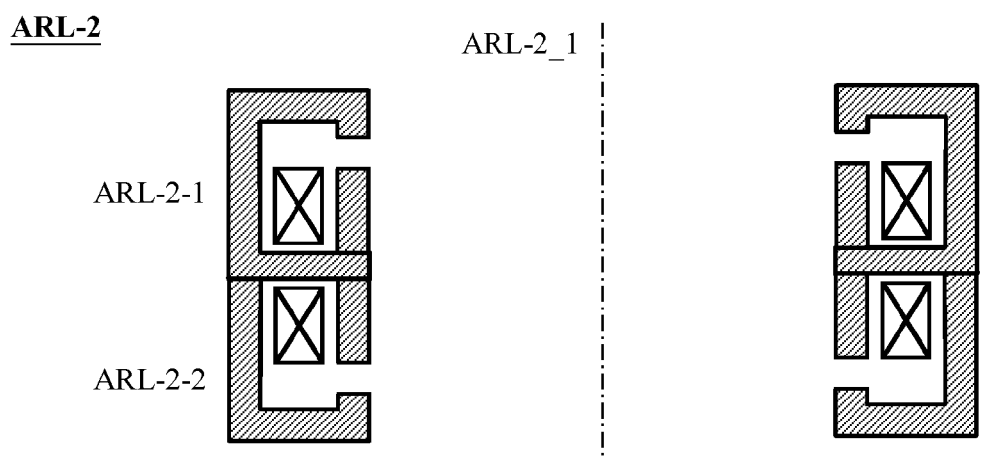

Reference is now made to FIGS. 3A and 3B, which are schematic diagrams each illustrating an exemplary configuration of anti-rotation lens comprising two magnetic lenses, consistent with embodiments of the present disclosure. Meanwhile, reference is made to FIGS. 3C and 3D as well, which are schematic diagrams illustrating exemplary magnetic field distribution in FIGS. 3A and 3B, consistent with embodiments of the present disclosure.

Figure 3C:
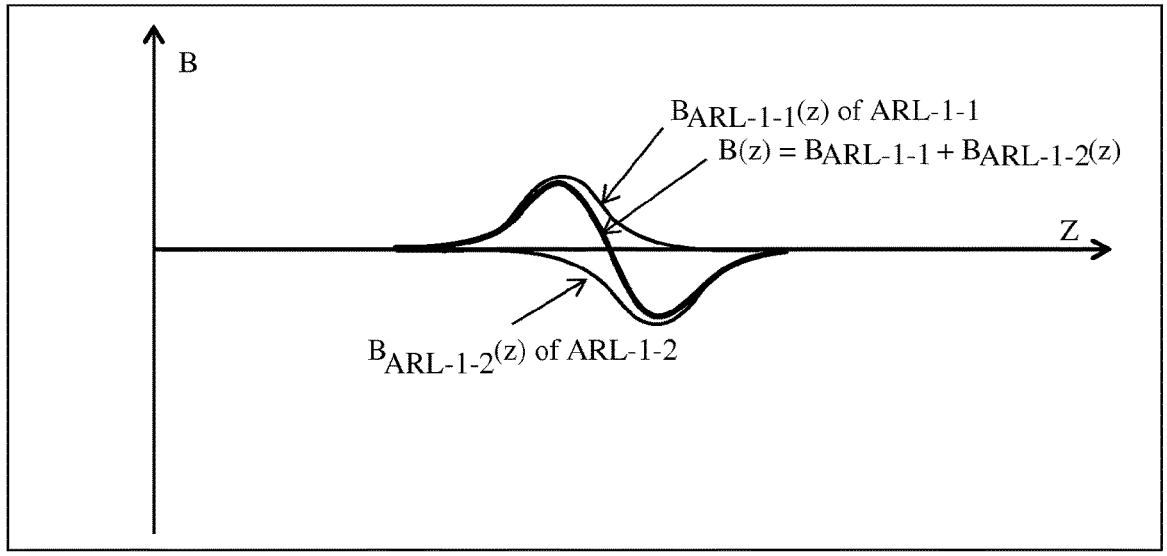
FIGS. 3C and 3D are schematic diagrams each illustrating exemplary magnetic field distribution in FIG. 3A, consistent with embodiments of the present disclosure.
Figure 3D:
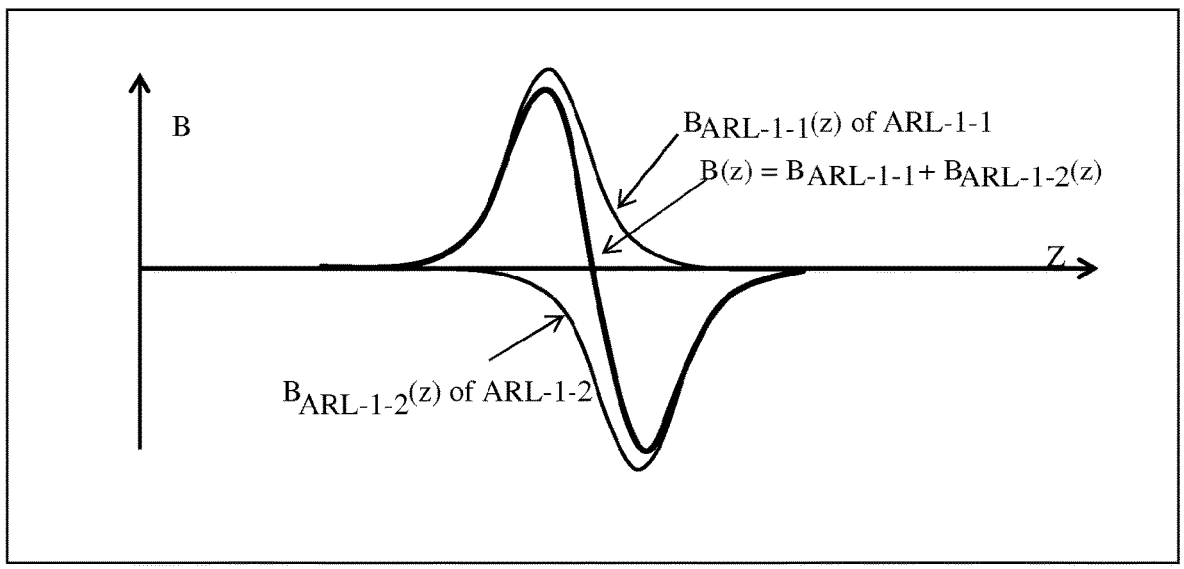

In FIG. 3A, two single magnetic lenses ARL-1-1 and ARL-1-2 of the anti-rotation lens ARL-1 are configured to align with an optical axis ARL-1_1 (on the Z-axis) thereof. Magnetic lenses ARL-1-1 and ARL-1-2 are excited to generate magnetic fields whose distributions $B_{ARL-1-1}(z)$ and $B_{ARL-1-2}(z)$ on optical axis ARL-1_1 are opposite in polarity, as shown in FIG. 3C or FIG. 3D. On-axis magnetic fields $B_{ARL-1-1}(z)$ and $B_{ARL-1-2}(z)$ can be adjusted based on an appropriate ratio. Accordingly, without affecting the total rotation angle of an electron beam passing through anti-rotation lens ARL-1, the focusing power thereof can be adjusted.

It is appreciated that in some embodiments, the two single magnetic lenses can be connected to partially share a common magnetic circuit. For example, as shown in FIG. 3B, two magnetic lenses ARL-2-1 and ARL-2-2 of anti-rotation lens ARL-2 are configured to partially share a common magnetic circuit therebetween.

FIG. 3A also illustrates how anti-rotation lens ARL-1 functions if being used as a condenser lens in a multi-beam apparatus such as the condenser lens 110 shown in FIG. 1A. For example, when magnetic fields $B_{ARL-1-1}(z)$ and $B_{ARL-1-2}(z)$ are set to be the same in distribution but opposite in polarity, as shown in FIG. 3C, primary-electron beam 102 is focused as the solid line in FIG. 3A. If single electron source 101 is not immersed by the total on-axis magnetic field B(z), which is the sum of magnetic fields $B_{ARL-1-1}(z)$ and $B_{ARL-1-2}(z)$, the total rotation angle of primary-electron beam 102 is zero after exiting anti-rotation lens ARL-1. When $B_{ARL-1-1}(z)$ and $B_{ARL-1-2}(z)$ are equally increased as shown in FIG. 3D, the focusing power of primary-electron beam 102 is increased (e.g., as shown by the dash line in FIG. 3A), and the rotation angle of primary-electron beam 102 is still zero after exiting anti-rotation lens ARL-1. If single electron source 101 is immersed by the total on-axis magnetic field B(z), the rotation angle with respect to FIG. 3C is not zero. $B_{ARL-1-1}(z)$ and $B_{ARL-1-2}(z)$ can be increased in an appropriate ratio to keep the rotation angle unchanged while increasing the focusing power.

Figure 4A:
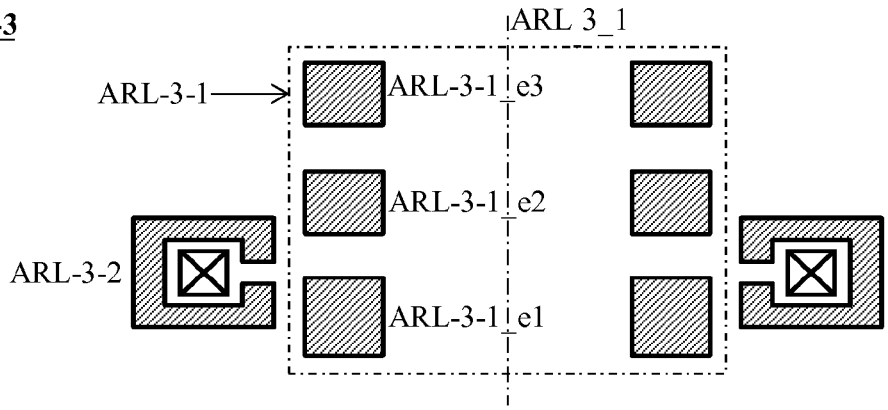
FIGS. 4A, 4B, and 4C are schematic diagrams each illustrating an exemplary configuration of anti-rotation lens, consistent with embodiments of the present disclosure.
Figure 4B:
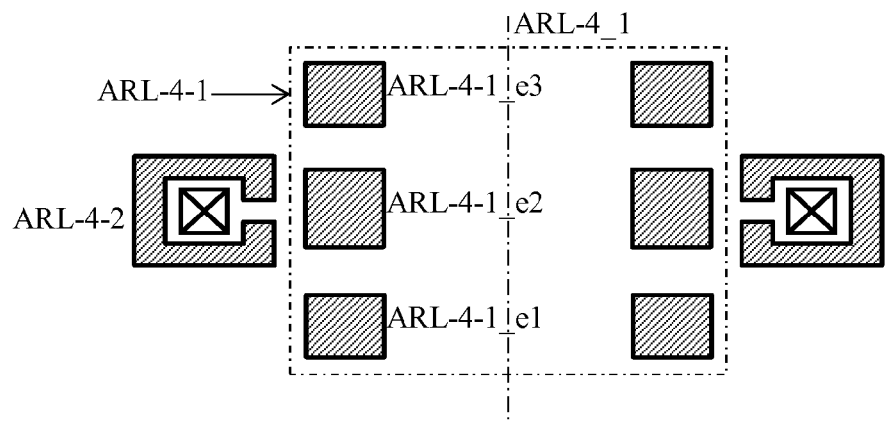
Figure 4C:
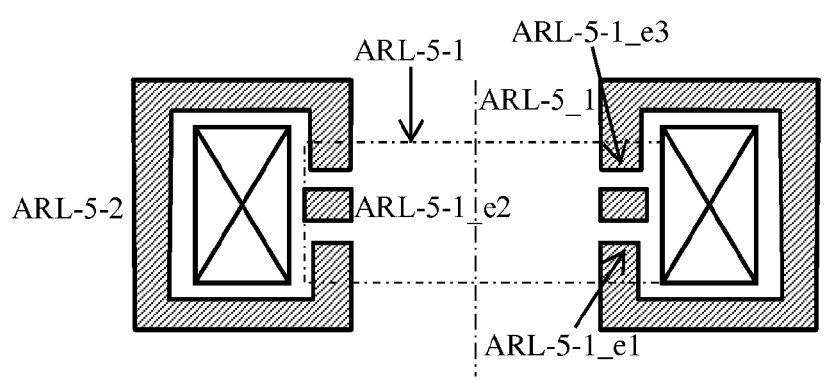

Reference is now made to FIGS. 4A, 4B, and 4C, which are schematic diagrams each illustrating an exemplary configuration of anti-rotation lens comprising an electrostatic lens and a magnetic lens, consistent with embodiments of the present disclosure. In FIG. 4A, anti-rotation lens ARL-3 comprises an electrostatic lens ARL-3-1 formed by three electrodes ARL-3-1_e1, ARL-3-1_e2 and ARL-3-1_e3 and a magnetic lens ARL-3-2. The electrostatic field of electrostatic lens ARL-3-1 and the magnetic field of magnetic lens ARL-3-2 are configured to partially overlap with each other. Accordingly, the energy of an electron beam passing through the magnetic field changes with the electrostatic field, and the rotation angle thereof depends on both the magnetic field and the electrostatic field. Therefore, by varying the magnetic field and the electrostatic field in an appropriate ratio, the focusing power of anti-rotation lens ARL-3 can be changed without influencing the rotation angle of the electron beam after exiting anti-rotation lens ARL-3.

In FIG. 4B, anti-rotation lens ARL-4 comprises an electrostatic lens ARL-4-1 and formed by three electrodes ARL-4-1_e1, ARL-4-1_e2 and ARL-4-1_e3 and a magnetic lens ARL-4-2. The electrostatic field of electrostatic lens ARL-4-1 and the magnetic field of magnetic lens ARL-4-2 fully overlap with each other; hence, keeping the rotation angle unchanged can be realized more efficiently.

In FIG. 4C, anti-rotation lens ARL-5 comprises an electrostatic lens ARL-5-1 and a magnetic lens ARL-5-2. Electrostatic lens ARL-5-1 is formed by two end electrodes ARL-5-1_e1 and ARL-5-1_e3 and a center electrode ARL-5-1_e2 located therebetween. Two end electrodes ARL-5-1_e1 and ARL-5-1_e3 are also the two pole-pieces of magnetic lens ARL-5-2. Hence the configuration is more compact and simple.

A movable anti-rotation lens has a movable first principal plane. For an electron beam, the position of the first principal plane and a focusing power of the movable anti-rotation lens can be changed without influencing a rotation angle of the electron beam. If movable condenser lens 210 in FIG. 1B is a movable anti-rotation lens, the mismatch in FIG. 2E can be eliminated. The movable anti-rotation lens can be formed by three magnetic lenses, or by one anti-rotation lens and one conventional lens (electrostatic or magnetic), or by two anti-rotation lenses. For an electron beam, by appropriately adjusting the excitations of the lenses inside the movable anti-rotation lens, the first principal plane and the focusing power thereof can vary simultaneously without affecting the rotation angle of the electron beam.

Figure 5A:
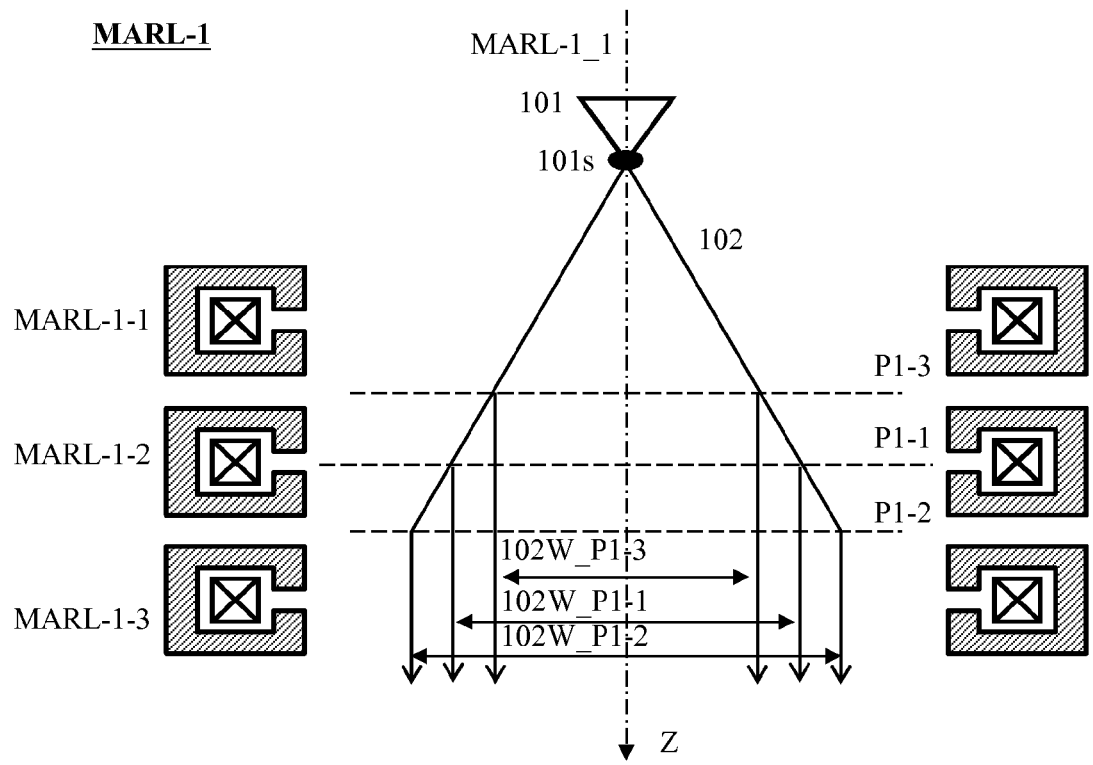
FIG. 5A is a schematic diagram illustrating an exemplary configuration of movable anti-rotation lens, consistent with embodiments of the present disclosure.
Figure 5B:
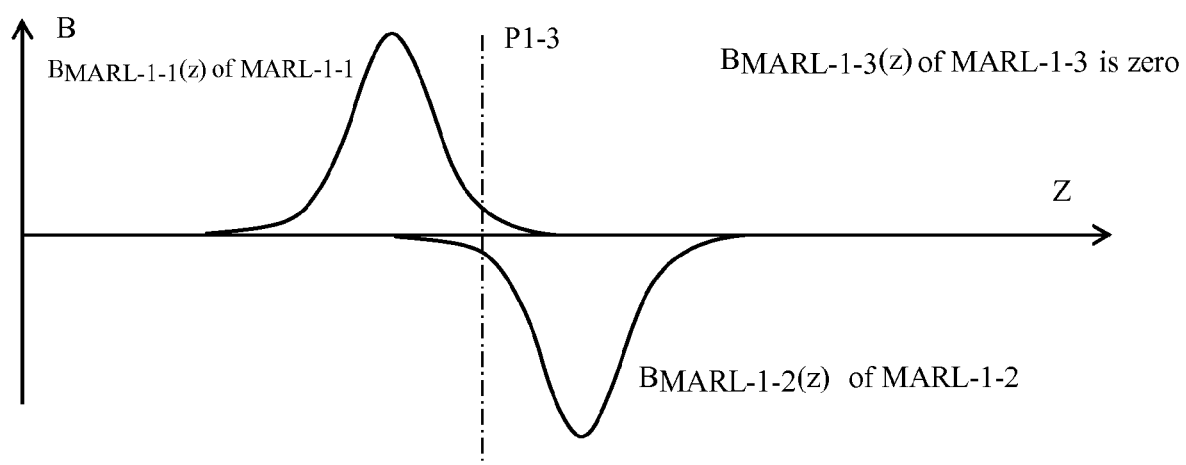
FIGS. 5B, 5C and 5D are schematic diagrams each illustrating exemplary magnetic field distribution in FIG. 5A, consistent with embodiments of the present disclosure.
Figure 5C:
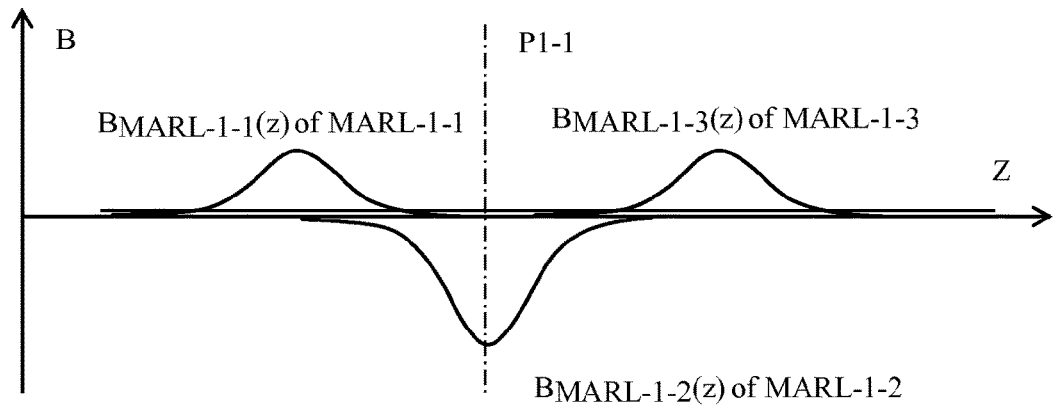
Figure 5D:
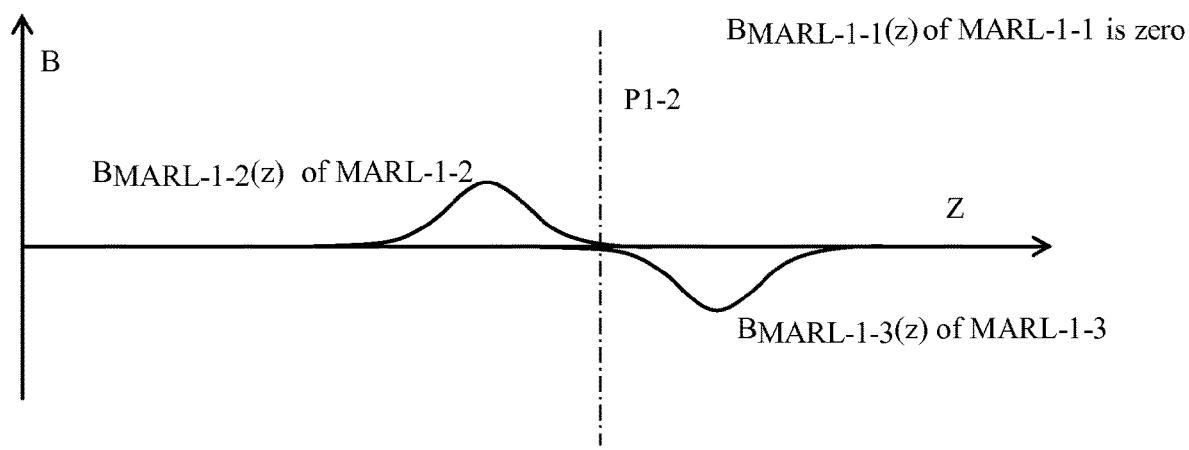

Reference is now made to FIG. 5A, which is a schematic diagram illustrating an exemplary configuration of movable anti-rotation lens comprising three magnetic lenses, consistent with embodiments of the present disclosure. Meanwhile, reference is made to FIGS. 5B, 5C, and 5D as well, which are schematic diagrams respectively illustrating exemplary magnetic field distribution in FIG. 5A, consistent with embodiments of the present disclosure. In FIG. 5A, three single magnetic lenses MARL-1-1, MARL-1-2 and MARL-1-3 of movable anti-rotation lens MARL-1 are aligned with an optical axis MARL-1_1 (on the Z-axis) thereof. Two or all of single magnetic lenses MARL-1-1~MARL-1-3 can be configured to connect and share a common magnetic circuit partially. Magnetic lenses MARL-1-1~MARL-1-3 are excited to generate magnetic fields whose on-axis distributions (field on optical axis MARL-1_1) are $B_{MARL-1-1}(z)$, $B_{MARL-1-2}(z)$ and $B_{MARL-1-3}(z)$. Two of on-axis magnetic fields $B_{MARL-1-1}(z)$, $B_{MARL-1-2}(z)$ and $B_{MARL-1-3}(z)$ are opposite in polarity, such as shown in FIGS. 5B-5D. The excitations of magnetic lenses MARL-1-1~MARL-1-3 are set to change the distribution of the total on-axis magnetic field, which is the sum of on-axis magnetic fields $B_{MARL-1-1}(z)$, $B_{MARL-1-2}(z)$ and $B_{MARL-1-3}(z)$, so as to move the first principal place and adjust the focusing power of movable anti-rotation lens MARL-1. Within the distribution of the total on-axis magnetic field, the polarity thereof alternates between the direction along the Z-axis and the direction opposite to the Z-axis to keep the total rotation angle unchanged.

FIG. 5A also illustrates how the movable anti-rotation lens functions if being used as a movable condenser lens in a multi-beam apparatus as movable condenser lens 210 in FIG. 1B. For example, when setting the excitations of on-axis magnetic lenses MARL-1-1~MARL-1-3 to make magnetic fields $B_{MARL-1-1}(z)$ and $B_{MARL-1-2}(z)$ same in distribution but opposite in polarity and the magnetic field $B_{MARL-1-3}(z)$ equal to zero, as shown in FIG. 5B, the first principal plane is at a plane P1-3 in FIG. 5A, that is close to single electron source 101. Primary-electron beam 102 from single electron source 101 is collimated at plane P1-3 and has a beam width 102W_P1-3 after exiting movable condenser lens MARL-1. If the single electron source 101 is not immersed by the total on-axis magnetic field, the rotation angle of primary-electron beam 102 is zero after exiting movable condenser lens MARL-1. By changing the excitations of the magnetic lenses to adjust on-axis magnetic fields $B_{MARL-1-1}(z)$, $B_{MARL-1-2}(z)$ and $B_{MARL-1-3}(z)$ as shown in FIG. 5C, the first principal plane moves away from single electron source 101 to plane P1-1 as shown in FIG. 5A. Primary-electron beam 102 is collimated at plane P1-1 and has an increased beam width 102W_P1-1 with the same rotation angle when the beam width is 102W_P1-3. By further changing the excitations of the magnetic lenses to adjust on-axis magnetic fields $B_{MARL-1-1}(z)$, $B_{MARL-1-2}(z)$ and $B_{MARL-1-3}(z)$ as shown in FIG. 5D, the first principal plane moves further away from single electron source 101 to plane P1-2 as shown in FIG. 5A. Primary-electron beam 102 is collimated at plane P1-2 and has a further increased beam width 102W_P1-2 with the same rotation angle when the beam width is 102W_P1-3 or 102W_P1-1. The first principal plane can be configured to move between planes P1-3 and P1-2, and primary-electron beam 102 therefore can be collimated and exit with a changed beam width and an unchanged rotation angle.

Figure 6A:
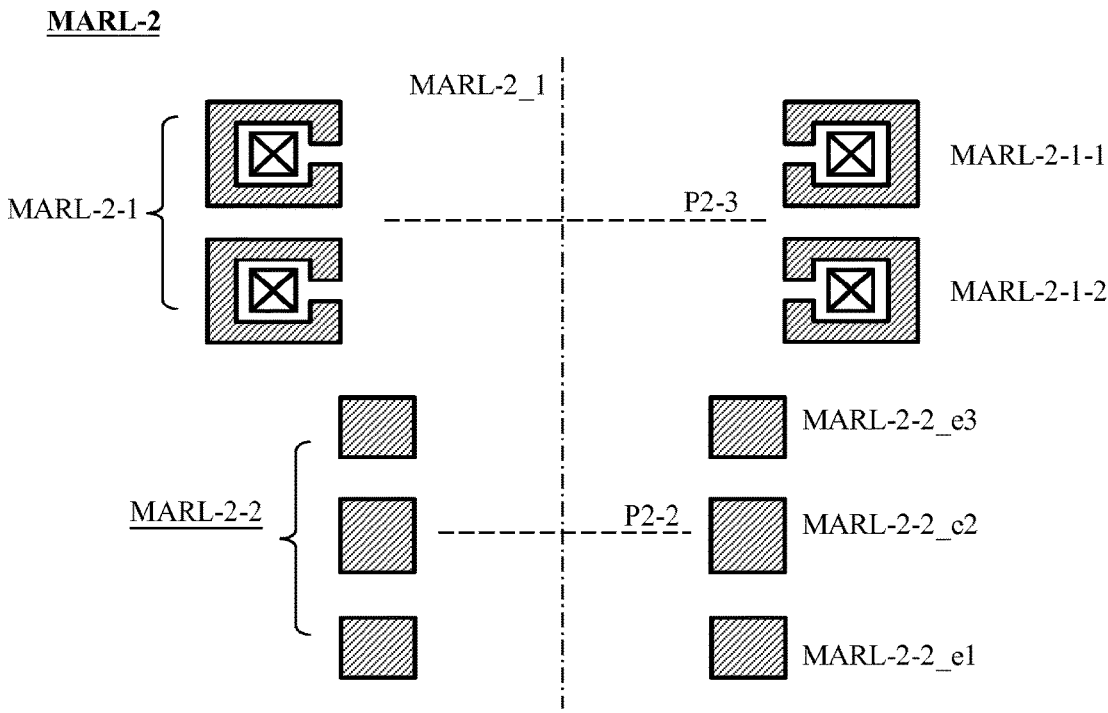
FIGS. 6A and 6B are schematic diagrams each illustrating an exemplary configuration of movable anti-rotation lens, consistent with embodiments of the present disclosure.

Reference is now made to FIG. 6A, which is a schematic diagram illustrating an exemplary configuration of movable anti-rotation lens with one anti-rotation lens and a conventional electrostatic lens, consistent with embodiments of the present disclosure. An anti-rotation lens MARL-2-1 and an electrostatic lens MARL-2-2 of movable anti-rotation lens MARL-2 are aligned with an optical axis MARL-2_1 thereof. Anti-rotation lens MARL-2-1 comprises two magnetic lenses MARL-2-1-1 and MARL-2-1-2, similar to anti-rotation lens ARL-1 in FIG. 3A. Electrostatic lens MARL-2-2 comprises three electrodes MARL-2-2_e1, MARL-2-2_e2 and MARL-2-2_e3. The first principal plane of the movable anti-rotation lens MARL-2 can be configured to locate at plane P2-3 between two single magnetic lenses MARL-2-1-1 and MARL-2-1-2, in response to electrostatic lens MARL-2-2 being OFF and anti-rotation lens MARL-2-1 being ON. The first principal plane can also be configured to locate at plane P2-2 between two end electrodes MARL-2-2_e3 and MARL-2-2_e1 and closer to center electrode MARL-2-2_e2, in response to anti-rotation lens MARL-2-1 being OFF and electrostatic lens MARL-2-2 being ON. By adjusting the focusing power ratio of anti-rotation lens MARL-2-1 and electrostatic lens MARL-2-2, the first principal plane can be configured to move between planes P2-3 and P2-2. Anti-rotation lens MARL-2-1 can keep the rotation angle unchanged and equal to a specific value while the first principal plane is moved. Electrostatic lens MARL-2-2 has no rotation function. Therefore if the specific value is not zero, the electrostatic lens MARL-2-2 has to function together with anti-rotation lens MARL-2-1. As a result, the moving range of the first principal plane is reduced.

Figure 6B:
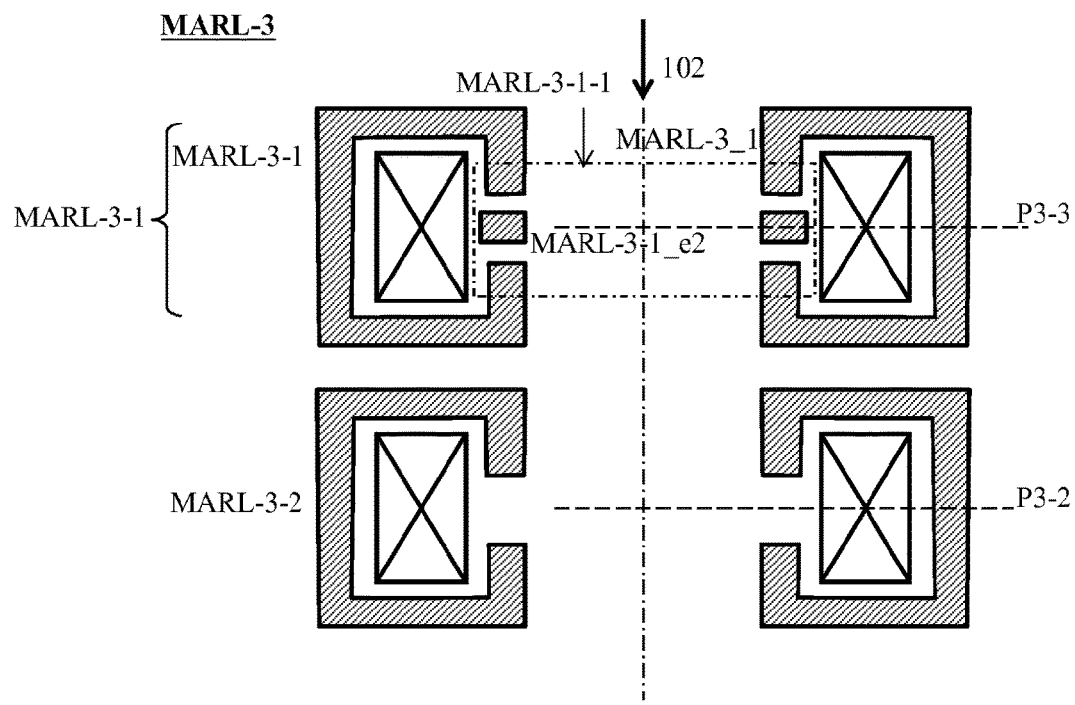

Reference is now made to FIG. 6B, which is a schematic diagram illustrating an exemplary configuration of movable anti-rotation lens with one anti-rotation lens and a conventional magnetic lens, consistent with embodiments of the present disclosure. An anti-rotation lens MARL-3-1 and a magnetic lens MARL-3-2 of movable anti-rotation lens MARL-3 are aligned with an optical axis MARL-3_1 thereof. Anti-rotation lens MARL-3-1 comprises one electrostatic lens MARL-3-1-1 and one magnetic lens MARL-3-1-2, similar to anti-rotation lens ARL-5 in FIG. 4C.

The first principal plane of movable anti-rotation lens MARL-3 can be configured to locate at plane P3-3 intersecting electrode MARL-3-1_e2 of anti-rotation lens MARL-3-1, in response to magnetic lens MARL-3-2 being OFF and anti-rotation lens MARL-3-1 being ON. The first principal plane can also be configured to locate at plane P3-2 between two pole-pieces of magnetic lens MARL-3-2, in response to anti-rotation lens MARL-3-1 being OFF and magnetic lens MARL-3-2 being ON. By adjusting the focusing power ratio of anti-rotation lens MARL-3-1 and magnetic lens MARL-3-2, the first principal plane can be configured to move between planes P3-3 and P3-2. The rotation angle due to anti-rotation lens MARL-3-1 can be adjusted with respect to the rotation angle due to magnetic lens MARL-3-2 to keep the total rotation angle due to movable anti-rotation lens MARL-3 unchanged while the first principal plane is moved.

Figure 7A:
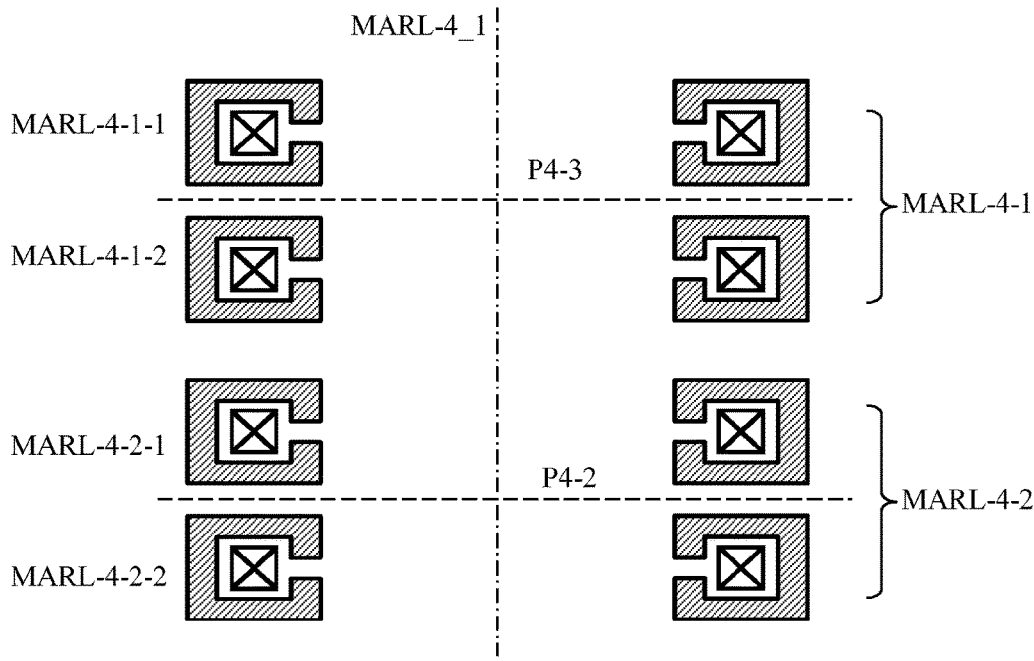
FIGS. 7A and 7B are schematic diagrams each illustrating an exemplary configuration of movable anti-rotation lens, consistent with embodiments of the present disclosure.
Figure 7B:
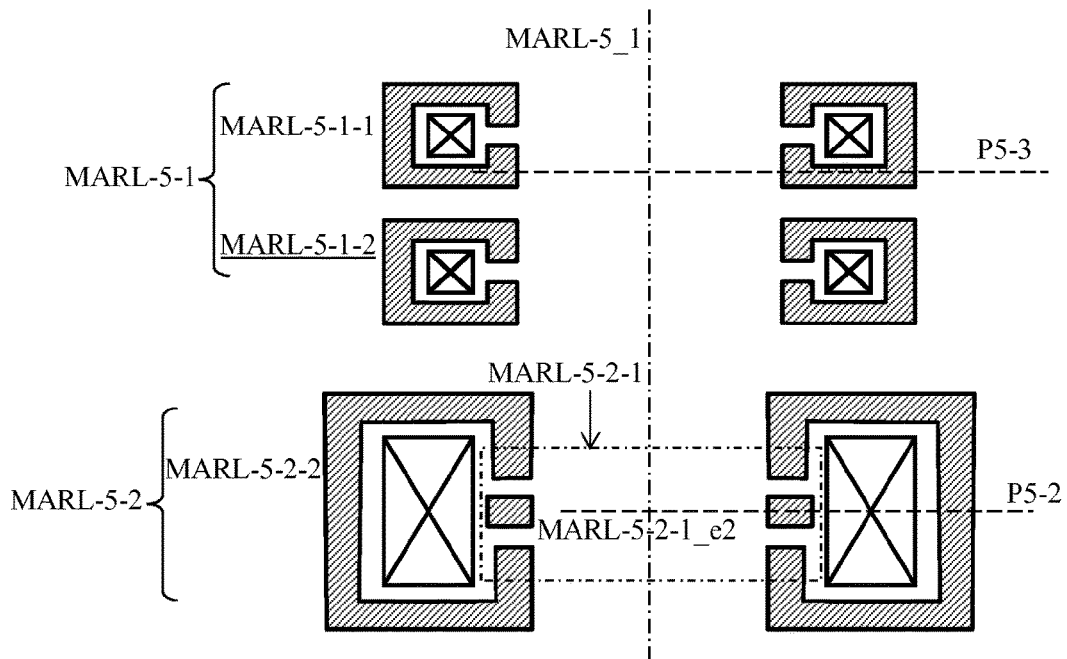

Reference is now made to FIGS. 7A and 7B, which are schematic diagrams each illustrating an exemplary configuration of movable anti-rotation lens with two anti-rotation lenses, consistent with embodiments of the present disclosure. In FIG. 7A, two anti-rotation lenses MARL-4-1 and MARL-4-2 of movable anti-rotation lens MARL-4 are aligned with an optical axis MARL-4_1 thereof. Anti-rotation lens MARL-4-1 comprises magnetic lenses MARL-4-1-1 and MARL-4-1-2. Anti-rotation lens MARL-4-2 comprises magnetic lenses MARL-4-2-1 and MARL-4-2-2. Both of anti-rotation lenses MARL-4-1 and MARL-4-2 are similar to the anti-rotation lens ARL-1 in FIG. 3A. The first principal plane of movable anti-rotation lens MARL-4 can be configured to locate at plane P4-3 between magnetic lenses MARL-4-1-1 and MARL-4-1-2, in response to anti-rotation lens MARL-4-1 being ON and anti-rotation lens MARL-4-2 being OFF. The first principal plane can also be configured to locate at plane P4-2 between magnetic lenses MARL-4-2-1 and MARL-4-2-2, in response to anti-rotation lens MARL-4-1 being OFF and anti-rotation lens MARL-4-2 being ON. By adjusting the focusing power ratio of anti-rotation lenses MARL-4-1 and MARL-4-2, the first principal plane can be configured to move between planes P4-3 and P4-2. The rotation angle due to each of anti-rotation lenses MARL-4-1 and MARL-4-2 can be adjusted to zero to eliminate the total rotation angle, or set to keep the total rotation angle unchanged while the first principal plane is moved.

In FIG. 7B, anti-rotation lenses MARL-5-1 and MARL-5-2 of movable anti-rotation lens MARL-5 are aligned with an optical axis MARL-5_1 thereof. Anti-rotation lens MARL-5-1 comprises magnetic lenses MARL5-1-1 and MARL-5-1-2, similar to the anti-rotation lens ARL-1 in FIG. 3A. Anti-rotation lens MARL-5-2 comprises an electrostatic lens MARL-5-2-1 and a magnetic lens MARL-5-2-2, similar to anti-rotation lens ARL-5 in FIG. 4C. The first principal plane of movable anti-rotation lens MARL-5 can locate at plane P5-3 within anti-rotation lenses MARL-5-1, in response to that anti-rotation lens MARL-5-1 being ON and anti-rotation lens MARL-5-2 being OFF. The first principal plane can also be located at plane P5-2 intersecting electrode MARL-5-2-1_e2 of anti-rotation lens MARL-5-2, in response to anti-rotation lens MARL-5-1 being OFF and anti-rotation lens MARL-5-2 being ON. By adjusting the focusing power ratio of anti-rotation lenses MARL-5-1 and MARL-5-2, the first principal plane can be configured to move between planes P5-3 and P5-2. The rotation angle due to anti-rotation lens MARL-5-2 is usually not equal to zero (equal to zero only if magnetic lens MARL-5-2-2 is OFF). The rotation angle due to anti-rotation lens MARL-5-1 can be adjusted accordingly in response to anti-rotation lens MARL-5-2, to keep the total rotation angle unchanged while the first principal plane is moved. In other words, the rotation angle due to anti-rotation lens MARL-5-1 cannot be zero when anti-rotation lens MARL-5-2 is OFF, and can be zero when anti-rotation lens MARL-5-2 is ON. Accordingly, plane P5-3 is close to one of magnetic lenses MARL-5-1-1 and MARL-5-1-2. Placing plane P5-3 close to magnetic lens MARL-5-1-1 is preferred because this placement can enlarge the available range between planes P5-3 and P5-2.

In a multi-beam apparatus which uses a condenser lens to vary currents of plural beamlets and a pre-beamlet-forming mechanism to reduce the Coulomb Effect, such as FIG. 1A, the Coulomb Effect can be reduced further if the condenser lens is configured by an anti-rotation lens described above to become an anti-rotation condenser lens. The anti-rotation condenser lens can keep rotation angles of plural beamlets unchanged or substantially unchanged when varying the currents thereof, the mismatch between the plural beamlets and the corresponding beam-limit openings can therefore be removed. Accordingly the sizes of beamlet-forming apertures in the pre-beamler-forming mechanism are not needed to be enlarged to cover the mismatch and therefore can cut off more electrons not in use.

Figure 8A:
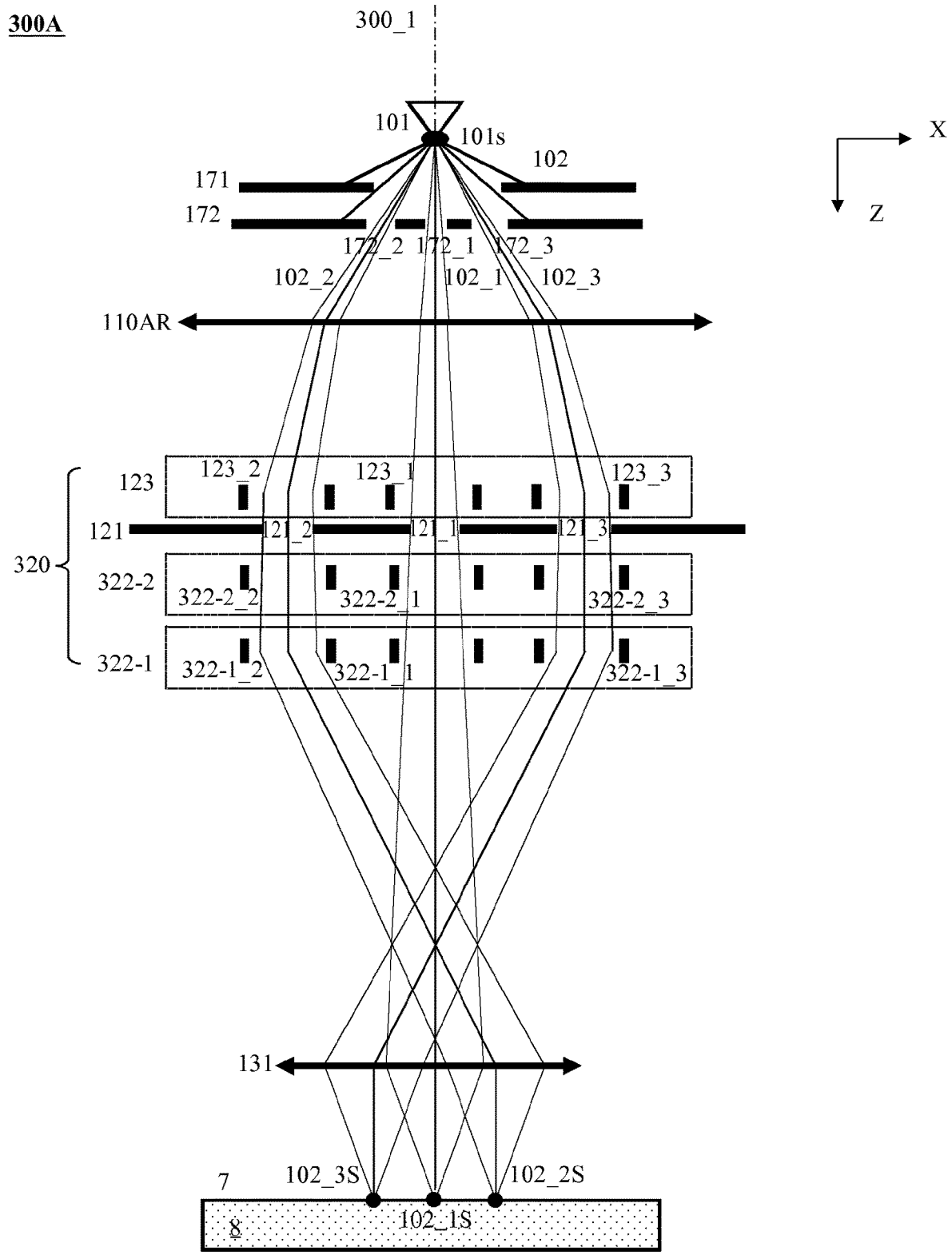
FIG. 8A is a schematic diagram illustrating an exemplary configuration of multi-beam apparatus, consistent with embodiments of the present disclosure.

Reference is now made to FIG. 8A, which is a schematic diagram illustrating an exemplary configuration of multi-beam apparatus 300A, consistent with embodiments of the present disclosure. A primary-electron beam 102 generated by an electron source 101 is trimmed into three beamlets 102_1, 102_2 and 102_3 by three beamlet-forming apertures 172_1, 172_2 and 172_3 of a pre-beamlet-forming mechanism 172. An anti-rotation condenser lens 110AR focuses beamlets 102_1~102_3 incident onto a source-conversion unit 320.

Source-conversion unit 320 comprises a pre-beamlet-bending mechanism 123 with three pre-bending micro-deflectors 123_1, 123_2 and 123_3, a beamlet-limit mechanism 121 with three beam-limit openings 121_1~121_3, a beamlet-compensation mechanism 322-2 with three micro-compensators 322-2_1, 322-2_2 and 322-2_3, and one image-forming mechanism 322-1 with three image-forming micro-deflectors 322-1_1, 322-1_2 and 322-1_3.

Three pre-bending micro-deflectors 123_1~123_3 respectively deflect three beamlets 102_1~102_3 perpendicularly incident onto three beam-limit openings 121_1~121_3. Beam-limit openings 121_1~121_3 cut off residual peripheral electrons of three beamlets 102_1~102_3 and therefore limit currents thereof. Three beamlets 102_1~102_3 are incident onto three micro-compensators 322-2_1~322-2_3 respectively along optical axes thereof. Then three beamlets 102_1~102_3 enter three image-forming micro-deflectors 322-1_1~322-1_3 along optical axes thereof respectively. Image-forming micro-deflectors 322-1_1~322-1_3 deflect beamlets 102_1~102_3 towards primary optical axis 300_1 of apparatus 300A and form three virtual images of electron source 101.

Objective lens 131 can focus three deflected beamlets 102_1~102_3 onto a surface 7 of a sample 8 under observation or inspection, i.e. projecting three virtual images onto surface 7. The three images formed by beamlets 102_1~102_3 on surface 7 form three probe spots 102_1S, 102_2S and 102_3S thereon.

The deflection angles of deflected beamlets 102_1~102_3 are adjusted to reduce the off-axis aberrations of three probe spots 102_1S~102_3S due to objective lens 131, and the three deflected beamlets consequently pass through or approach the front focal point of objective lens 131. Micro-compensators 322-2_1~322-2_3 are adjusted to compensate the residual field curvature and the astigmatism aberrations of probe spots 102_1S~102_3S. Image-forming mechanism 322-1 can further comprise auxiliary micro-compensators for aberration compensation, functioning together with beamlet-compensation mechanism 322-2.

Figure 8B:
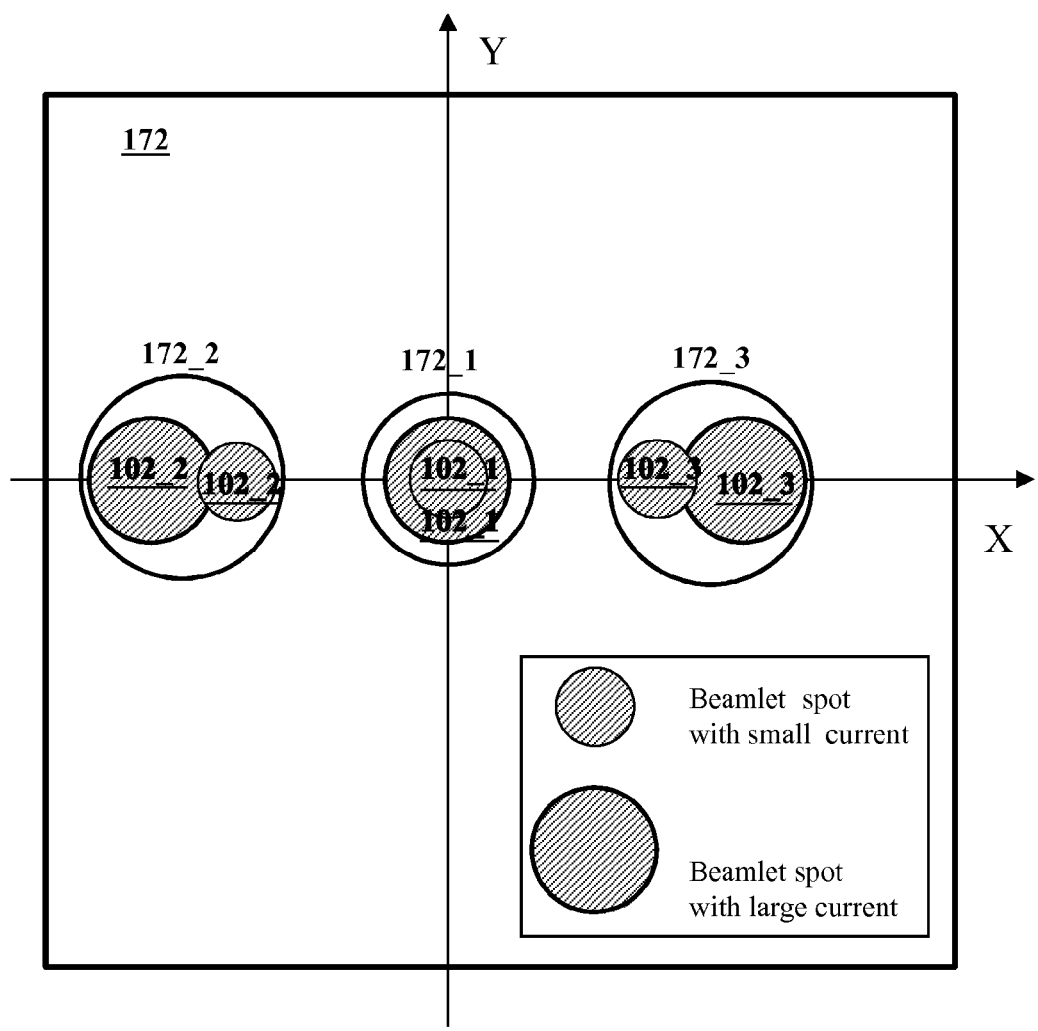
FIGS. 8B and 8C each illustrates an exemplary configuration of pre-beamlet-forming mechanism of FIG. 8A, consistent with embodiments of the present disclosure.
Figure 8C:
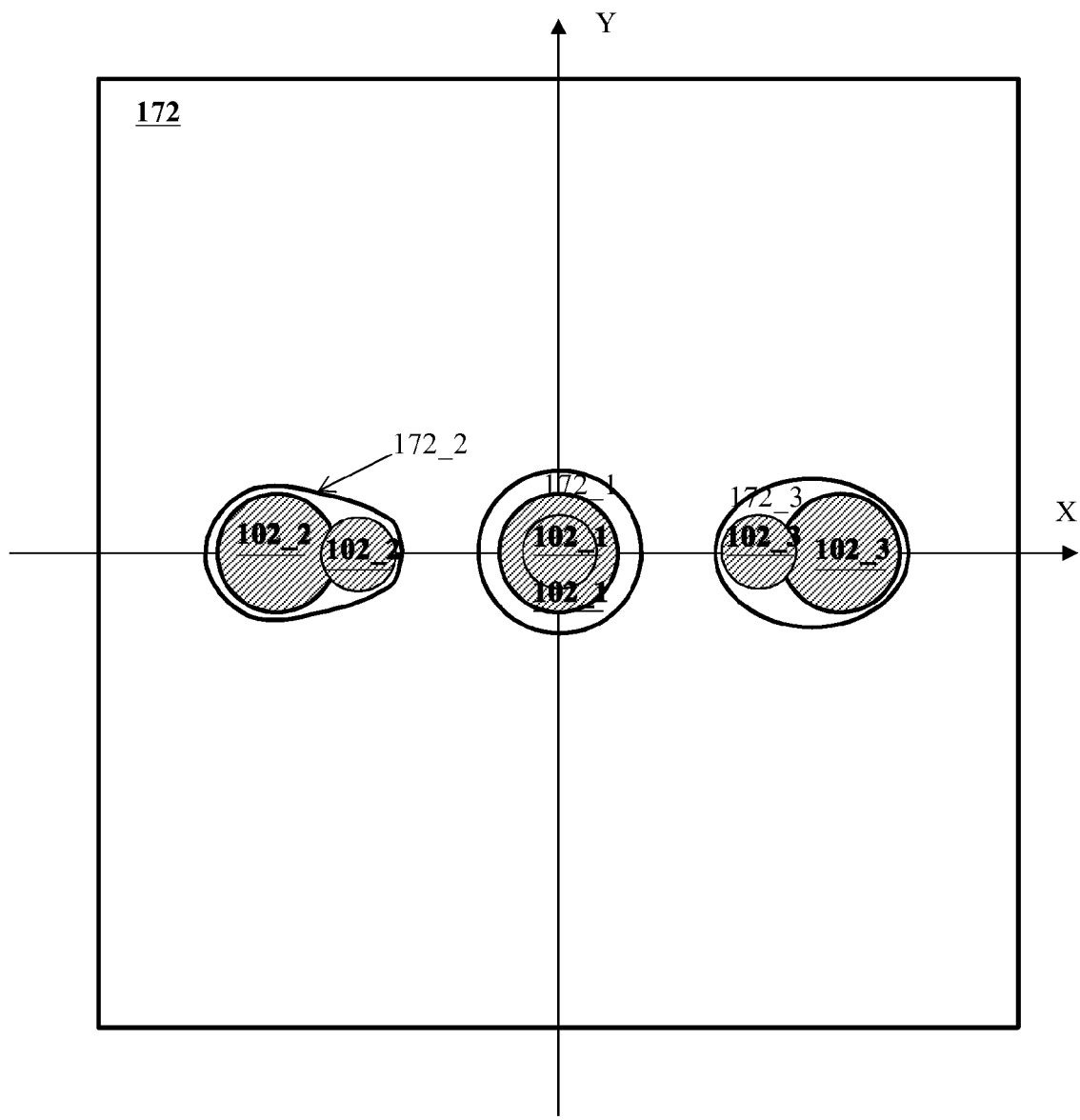

Reference is now made to FIGS. 8B and 8C, which are cross sectional diagrams at X-Y plane of pre-beamlet-forming mechanism 172 of FIG. 8A, consistent with embodiments of the present disclosure. By adjusting the focusing power of anti-rotation condenser lens 110AR, the probe currents of probe spots 102_1S~102_3S can be changed. FIG. 8B shows sizes and positions of three beamlets 102_1~102_3 with respect to two settings of the focusing power. The focusing power is stronger in the second setting than in the first setting. For the first setting, only the electrons within the small circle marks 102_1~102_3 can pass through three beam-limit openings 121_1~121_3. For the second setting, only the electrons within the large circle marks 102_1~102_3 can pass though the three beam-limit openings 121_1~121_3. The probe currents of three probe spots 102_1S~102_3S are therefore larger in the second setting than in the first setting. Because anti-rotation condenser lens 110AR keeps the rotation angles of beamlet 102_1~102_3 unchanged with respect to the two settings, the circle marks of beamlets 102_1~102_3 move in radial directions only.

The shapes and sizes of beamlet-forming apertures 172_1~172_3 are configured to cover the areas that the circle marks of beamlets 102_1~102_3 cover when the focusing power is adjusted within the range of two settings (the largest focusing power, the smallest focusing power). The shape of each beamlet-forming aperture can be configured to make the size thereof as small as possible, so that the Coulomb Effect can accordingly be reduced. In FIG. 8B, beamlet-forming apertures 172_1~172_3 are round in shape, and center beamlet-forming aperture 172_1 is smaller than edge beamlet-forming apertures 172_2 and 172_3. Shapes of beamlet-forming apertures can be different, such as shown in FIG. 8C with respect to the same settings of the focusing power in FIG. 8B. In FIG. 8C, center beamlet-forming aperture 172_1 is round, left edge beamlet-forming aperture 172_2 is in a polygon shape and right edge beamlet-forming aperture 172_3 is in an elliptical shape. According to the same principle, size, and shape of beamlet-forming aperture can be arbitrary. Sizes and shapes of beamlet-forming aperture disclosed in the embodiments are for exemplary purposes only and are not limiting.

Figure 9A:
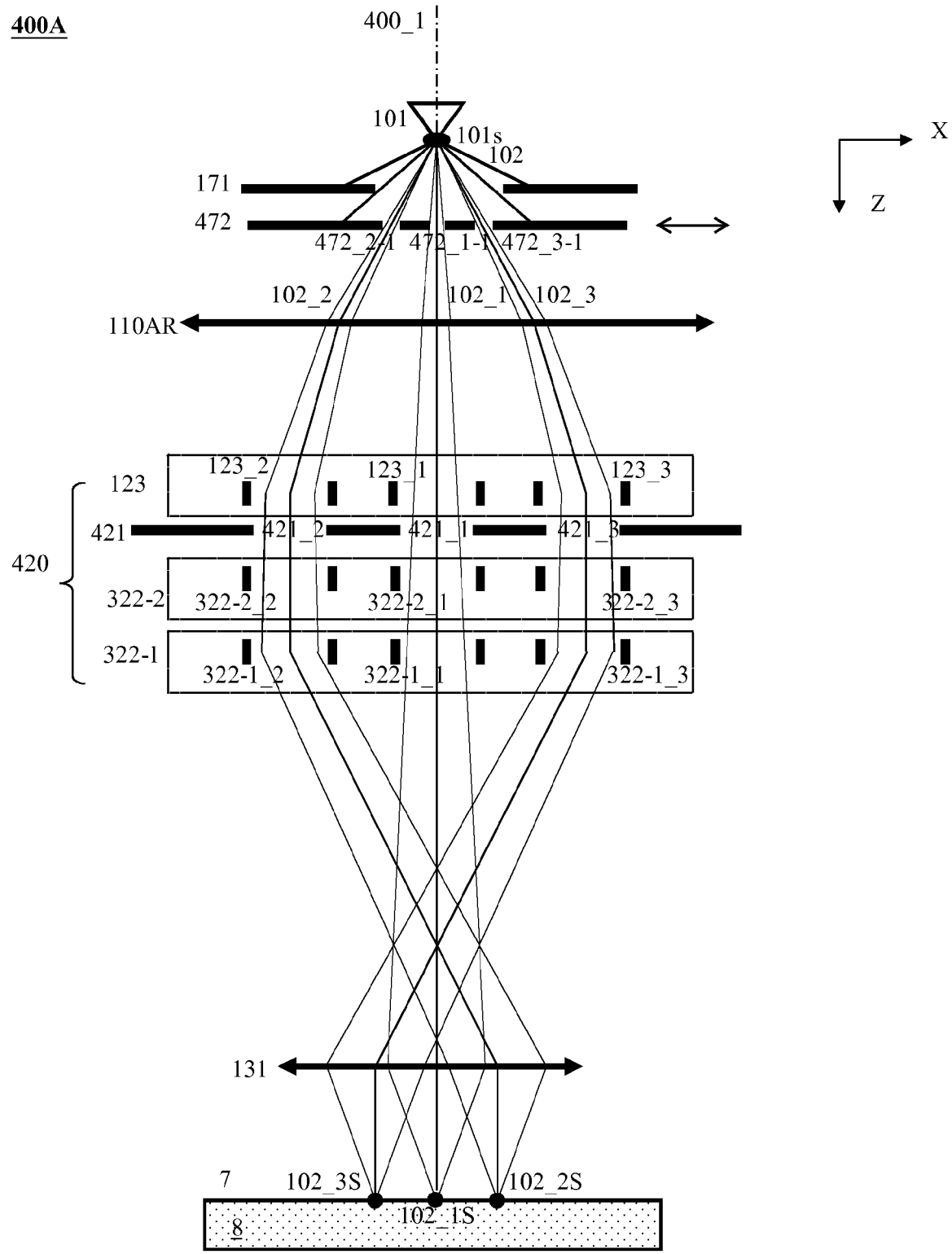
FIGS. 9A and 9C are schematic diagrams illustrating an exemplary configuration of multi-beam apparatus and beam paths, consistent with embodiments of the present disclosure.

Reference is now made to FIG. 9A, which is a schematic diagram illustrating an exemplary configuration of multi-beam apparatus 400A, consistent with embodiments of the present disclosure. In this embodiment, beamlet-forming apertures 472_1, 472_2 and 472_3 of pre-beamlet-forming mechanism 472 divide primary-electron beam 102 into three beamlets 102_1~102_3 and meanwhile function as beam-limit apertures to limit the currents of beamlets. Accordingly, in comparison with FIG. 8A, all the electrons not in use are cut off much earlier, and the Coulomb Effect therefore is reduced to a greater degree. Electrons of beamlets 102_1~102_3 hitting edges of beamlet-forming apertures 472_1~472_3 may generate scattered electrons therefrom. These scattered electrons stray from normal paths of beamlets 102_1~102_3 and become background noises of the images generated by beamlets 102_1~102_3. In source-conversion unit 420, beam-limit openings 421_1, 421_2 and 421_3 of beamlet-limit mechanism 421 function as contrast apertures to cut off the scattered electrons. Beamlet-limit mechanism 421 can also be located between beamlet-compensation mechanism 322-2 and image-forming mechanism 322-1.

The probe currents of three probe spots 102_1S~102_3S can be varied by changing the sizes of beamlet-forming apertures 472_1~472_3. To change the sizes, the movable pre-beamlet-forming mechanism 472 can be configured to be movable and have two or more aperture groups. Sizes of apertures in one group can be different from sizes of apertures in another group. The pre-beamlet-forming mechanism 472 can be moved to set apertures in one aperture group to work as beamlet-forming apertures.

Figure 9B:
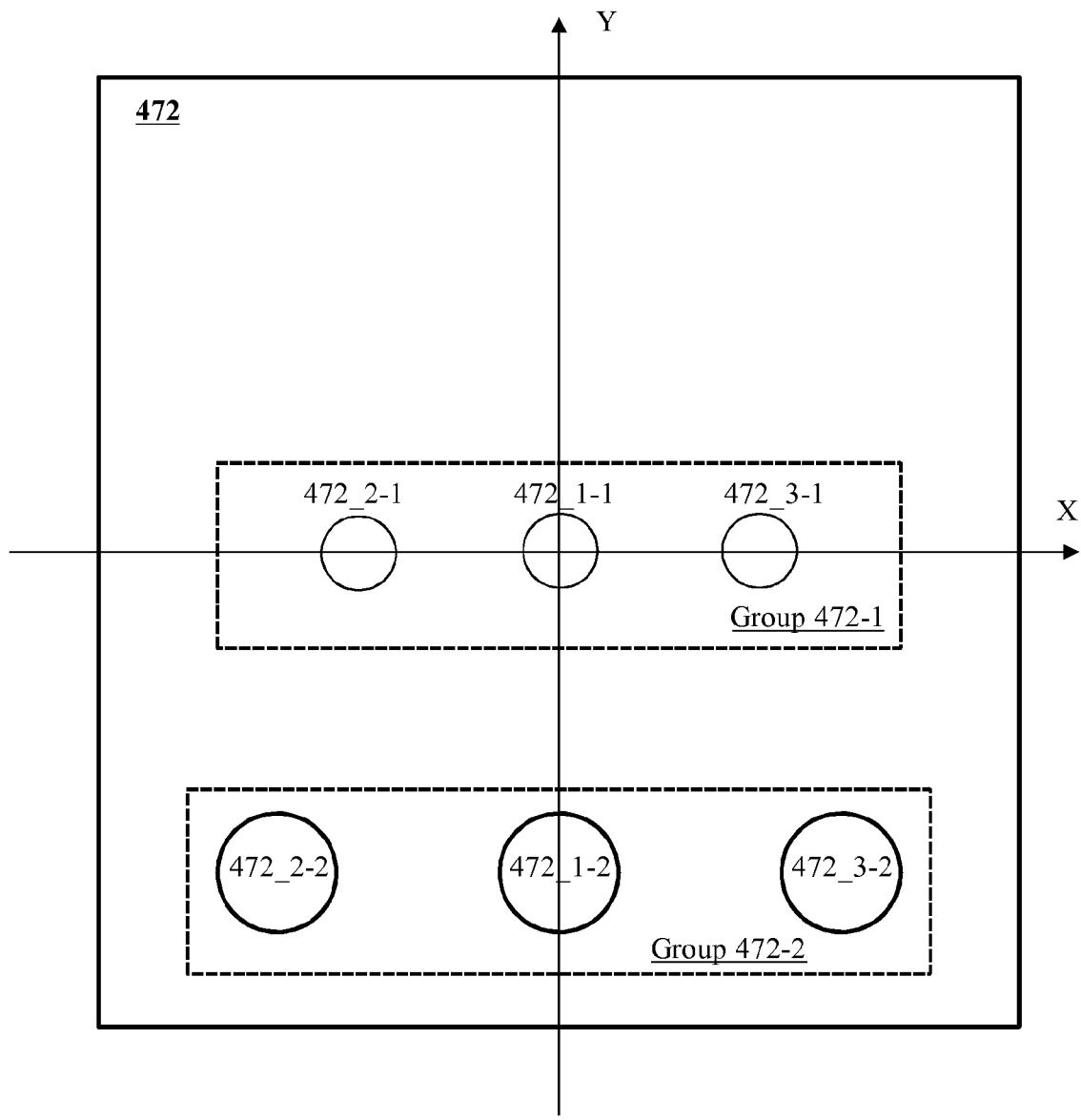
FIG. 9B is a schematic diagram illustrating an exemplary configuration of pre-beamlet-forming mechanism of FIGS. 9A and 9C, consistent with embodiments of the present disclosure.

Reference is now made to FIG. 9B, which is a schematic diagram illustrating an exemplary configuration of movable pre-beamlet-forming mechanism 472 of FIG. 9A, consistent with embodiments of the present disclosure. In FIG. 9B, the movable pre-beamlet-forming mechanism 472 has two aperture groups. Sizes and intervals of apertures 472_1-1, 472_2-1, and 472_3-1 of group 472-1 are configured to be smaller than those of apertures 472_1-2, 472_2-2, and 472_3-2 of group 472-2. Probe currents provided by group 472-1 are therefore smaller than group 472-2.

When group 472-1 is selected, pre-beamlet-forming mechanism 472 is moved so that apertures 472_1-1-472_3-1 can divide primary-electron beam 102 into beamlets 102_1~102_3. The corresponding paths of beamlets 102_1~102_3 are shown in FIG. 9A. When group 472-2 is selected, pre-beamlet-forming mechanism 472 is moved so that apertures 472_1-2~472_3-2 can divide the primary-electron beam 102 into beamlets 102_1~102_3. The corresponding paths of beamlets 102_1~102_3 are shown in FIG. 9C.

Figure 9C:
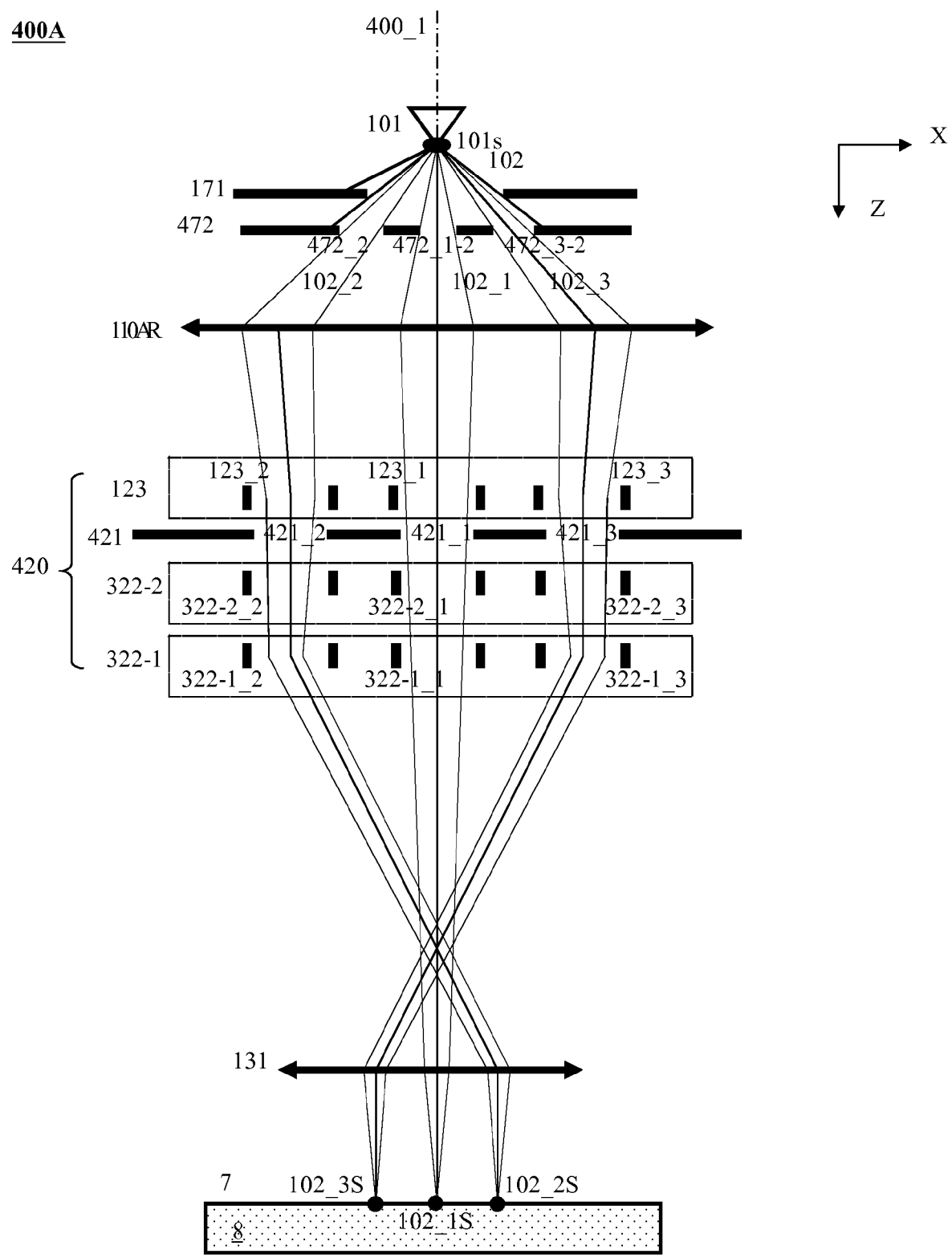

Beamlets 102_1~102_3 in FIG. 9C are focused more strongly than in FIG. 9A so as to enter pre-bending micro-deflectors 123_1~123_3 of pre-beamlet-bending mechanism 123. The anti-rotation condenser lens 110AR keeps the rotation angles of beamlets 102_1~102_3 unchanged when different aperture groups are used. Aperture groups therefore can be placed in parallel, and pre-beamlet-forming mechanism 472 is not required to rotate when aperture group is changed. No-rotation simplifies the structure of pre-beamlet-forming mechanism 472.

In a multi-beam apparatus that uses a movable condenser lens to vary currents of plural beamlets and a pre-beamlet-forming mechanism to reduce the Coulomb Effect, such as FIG. 1B, the Coulomb Effect can be reduced further if the movable condenser lens is configured by a movable anti-rotation lens described above to become a movable anti-rotation condenser lens. The movable anti-rotation condenser lens can keep rotation angles of plural beamlets unchanged or substantially unchanged when varying the currents thereof, the mismatch between the plural beamlets and the corresponding beam-limit openings can therefore be removed. Rotation angles of plural beamlets can be viewed as substantially unchanged if the change is not larger than 6°. Accordingly the sizes of beamlet-forming apertures in the pre-beamlet-forming mechanism are not needed to be enlarged to cover the mismatch and therefore can cut off more electrons not in use.

Figure 10:
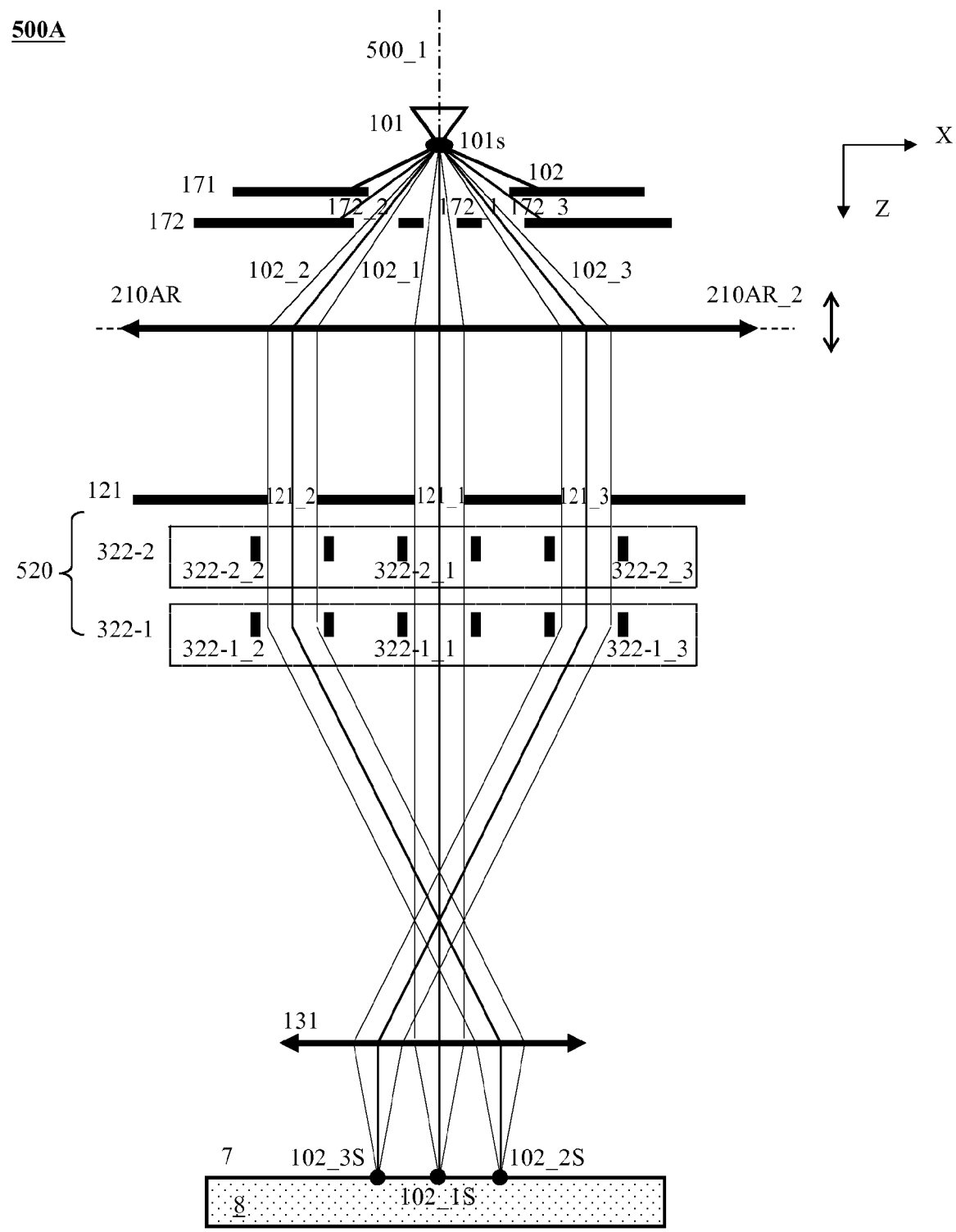
FIG. 10 is a schematic diagram illustrating an exemplary configuration of multi-beam apparatus, consistent with embodiments of the present disclosure.

Reference is now made to FIG. 10, which is schematic diagrams illustrating an exemplary configuration of multi-beam apparatus 500A, consistent with embodiments of the present disclosure. In these embodiments, a primary-electron beam 102 generated by an electron source 101 is trimmed into three beamlets 102_1, 102_2 and 102_3 by three beamlet-forming apertures 172_1, 172_2 and 172_3 of a pre-beamlet-forming mechanism 172. A movable anti-rotation condenser lens 210AR focuses beamlets 102_1~102_3 to be perpendicularly incident onto a source-conversion unit 520.

Source-conversion unit 520 comprises a beamlet-limit mechanism 121 with three beam-limit openings 121_1~121_3, a beamlet-compensation mechanism 322-2 with three micro-compensators 322-2_1, 322-2_2 and 322-2_3, and an image-forming mechanism 322-1 with three image-forming micro-deflectors 322-1_1, 322-1_2 and 322-1_3. Beam-limit openings 121_1~121_3 cut off residual peripheral electrons of three beamlets 102_1~102_3 and therefore limit the currents thereof. Three beamlets 102_1~102_3 are incident onto three micro-compensators 322-2_1~322-2_3 respectively along optical axes thereof. Then three beamlets 102_1~102_3 enter three image-forming micro-deflectors 322-1_1~322-1_3 respectively along optical axes thereof. Image-forming micro-deflectors 322-

1_1~322-1_3 deflect beamlets 102_1~102_3 towards primary optical axis 500_1 of apparatus 500 and form three virtual images of electron source 101.

Objective lens 131 focuses three deflected beamlets 102_1~102_3 onto a surface 7 of a sample under observation 8, i.e. projecting three virtual images onto the surface 7. The images formed by beamlets 102_1~102_3 on surface 7 generate three probe spots 102_1S, 102_2S, and 102_3S thereon.

The deflection angles of deflected beamlets 102_1~102_3 are adjusted to reduce the off-axis aberrations of three probe spots 102_1s~102_3s due to objective lens 131, and the three deflected beamlets consequently pass through or approach the front focal point of objective lens 131. Micro-compensators 322-2_1~322-2_3 are adjusted to compensate the residual field curvature and the astigmatism aberrations of probe spots 102_1S~102_3S. Image-forming mechanism 322-1 can further comprise auxiliary micro-compensators for aberration compensation, functioning together with beamlet-compensation mechanism 322-2.

By adjusting the focusing power of movable anti-rotation condenser lens 210AR and accordingly moving the position of the first principal plane 210AR_2 thereof, the probe currents of probe spots 102_1S~102_3S can be changed while keeping beamlets 102_1~102_3 perpendicularly incident onto source-conversion unit 520 and having unchanged or substantially unchanged rotation angles. FIG. 8B can also be used to show the sizes and positions of three beamlets 102_1~102_3 on pre-beamlet-forming mechanism 172 with respect to two example settings of the focusing power and first principal plane 210AR_2. The focusing power in the second setting is stronger than in the first setting, and the position of the first principal plane in the second setting is closer to electron source 101 than in the first setting. For the first setting, only the electrons within small circle marks 102_1~102_3 can pass through three beam-limit openings 121_1~121_3. For the second setting, only the electrons within large circle marks 102_1~102_3 can pass through three beam-limit openings 121_1~121_3. The probe currents of three probe spots 102_1S~102_3S are therefore larger in the second setting than in the first setting. As anti-rotation condenser lens 210AR can keep the rotation angles of beamlet 102_1~102_3 unchanged with respect to the two settings, the circle marks of beamlets 102_1~102_3 move in a radial direction only.

The shapes and sizes of beamlet-forming apertures 172_1~172_3 are configured to cover the areas which the circle marks of beamlets 102_1~102_3 cover when movable anti-rotation condenser lens 210AR is adjusted within the range of the two settings. The shape of each beamlet-forming aperture can be configured to reduce the size thereof, so that the Coulomb Effect can be accordingly reduced. It is appreciated that the size of each beamlet-forming aperture can be reduced as much as possible to accordingly reduce the Coulomb Effect as much as possible. Hence, shapes of beamlet-forming apertures can be the same (e.g., as shown in FIG. 8B) or different from each other (e.g., as shown in FIG. 8C). Beamlet-forming apertures 172_1~172_3 can be configured round, elliptical, in polygon, or in any other arbitrary shape.

Figure 11A:
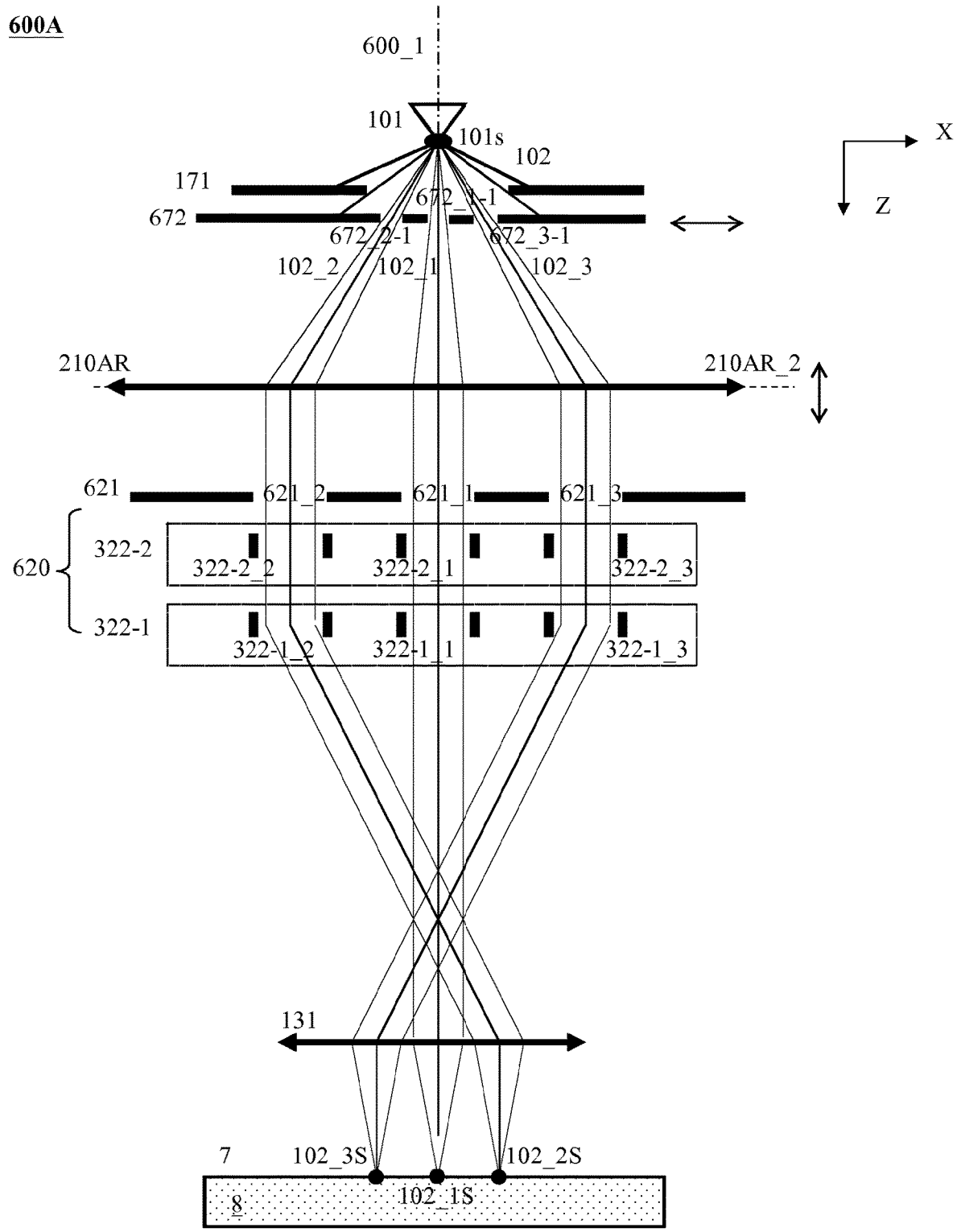
FIGS. 11A and 11C are schematic diagrams illustrating an exemplary configuration of multi-beam apparatus and beam paths, consistent with embodiments of the present disclosure.

Reference is now made to FIG. 11A, which is a schematic diagram illustrating an exemplary configuration of multi-beam apparatus 600A, consistent with embodiments of the present disclosure. In this embodiment, beamlet-forming apertures 672_1, 672_2, and 672_3 of pre-beamlet-forming mechanism 672 can divide primary-electron beam 102 into three beamlets 102_1~102_3 and meanwhile function as beam-limit apertures to limit the currents of beamlets. Accordingly, in comparison with FIG. 10, all the electrons not in use are cut off much earlier, and the Coulomb Effect therefore is reduced to a greater degree. Electrons of beamlets 102_1~102_3 hitting edges of beamlet-forming apertures 672_1~672_3 may generate scattered electrons therefrom. These scattered electrons stray from normal paths of beamlets 102_1~102_3 and become background noises of the images generated by beamlets 102_1~102_3. In the source-conversion unit 620, beam-limit openings 621_1, 621_2, and 621_3 of beamlet-limit mechanism 621 function as contrast apertures to cut off the scattered electrons. Beamlet-limit mechanism 621 can also be located between beamlet-compensation mechanism 322-2 and image-forming mechanism 322-1.

The probe currents of the three probe spots 102_1S~102_3S can be varied by changing the sizes of three beamlet-forming apertures 672_1~672_3. To change the sizes, pre-beamlet-forming mechanism 672 can be configured to be movable and have two or more aperture groups. Sizes of apertures in one group are different from sizes of apertures in another group. Pre-beamlet-forming mechanism 672 can be moved to set apertures in one aperture group to work as beamlet-forming apertures.

Figure 11B:
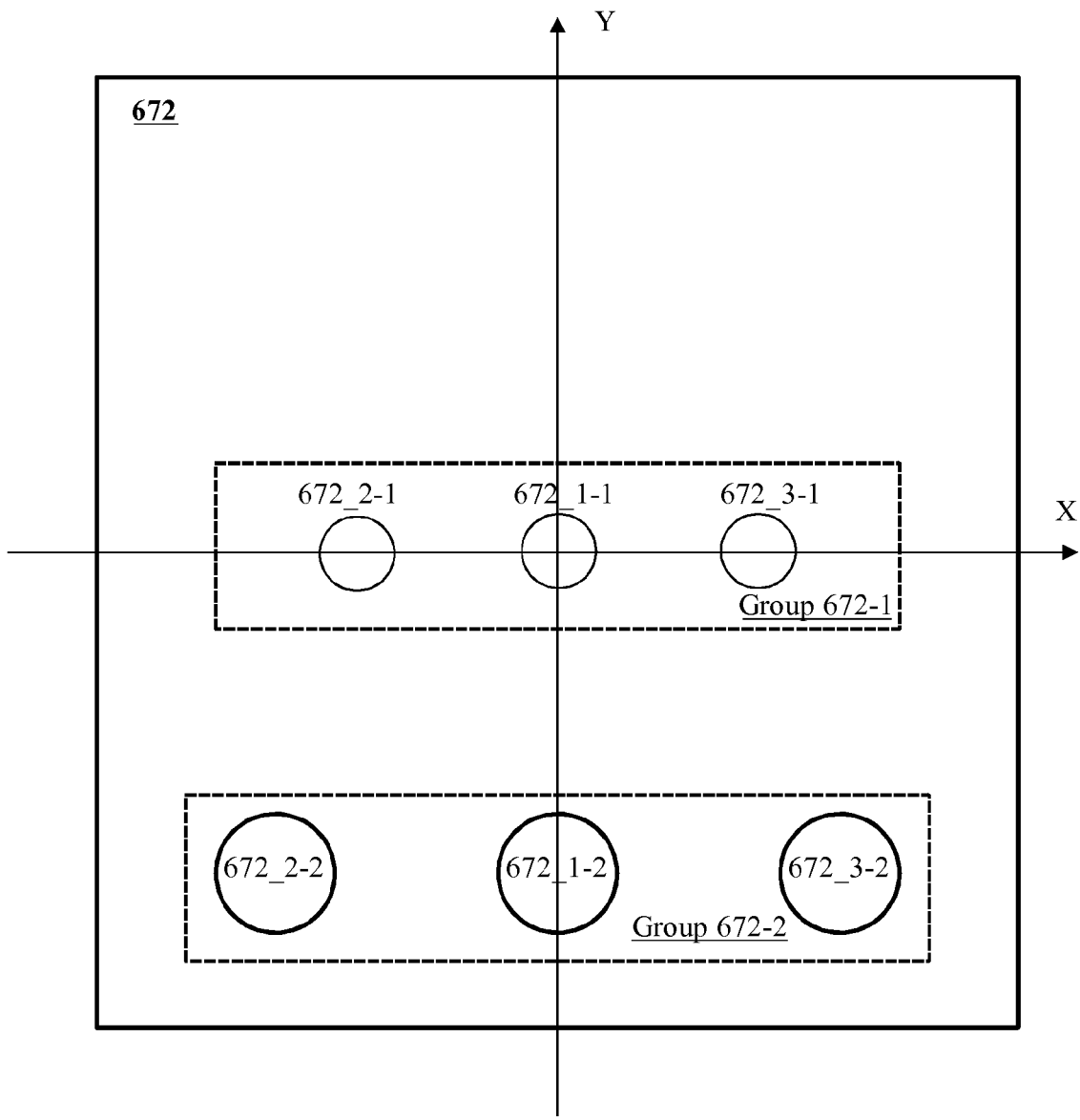
FIG. 11B is a schematic diagram illustrating an exemplary configuration of pre-beamlet-forming mechanism of FIGS. 11A and 11C, consistent with embodiments of the present disclosure.

Reference is now made to FIG. 11B, which is a schematic diagrams illustrating an exemplary configuration of movable pre-beamlet-forming mechanism 672 of FIG. 11A, consistent with embodiments of the present disclosure. In FIG. 11B, movable pre-beamlet-forming mechanism 672 has two aperture groups. Sizes and intervals of apertures 672_1-1, 672_2-1, and 672_3-1 of group 672-1 are configured to be smaller than those of apertures 672_1-2, 672_2-2, and 672_3-2 of group 672-2. Probe currents provided by group 672-1 are smaller than group 672-2. When group 672-1 is selected, pre-beamlet-forming mechanism 672 is moved so that apertures 672_1-1~672_3-1 can divide the primary-electron beam 102 into beamlets 102_1~102_3. The corresponding paths of beamlets 102_1~102_3 are shown in FIG. 11A. When group 672-2 is selected, pre-beamlet-forming mechanism 672 is moved so that apertures 672_1-2~672_3-2 can divide the primary-electron beam 102 into beamlets 102_1~102_3. The corresponding paths of beamlets 102_1~102_3 are shown in FIG. 11C.

Figure 11C:
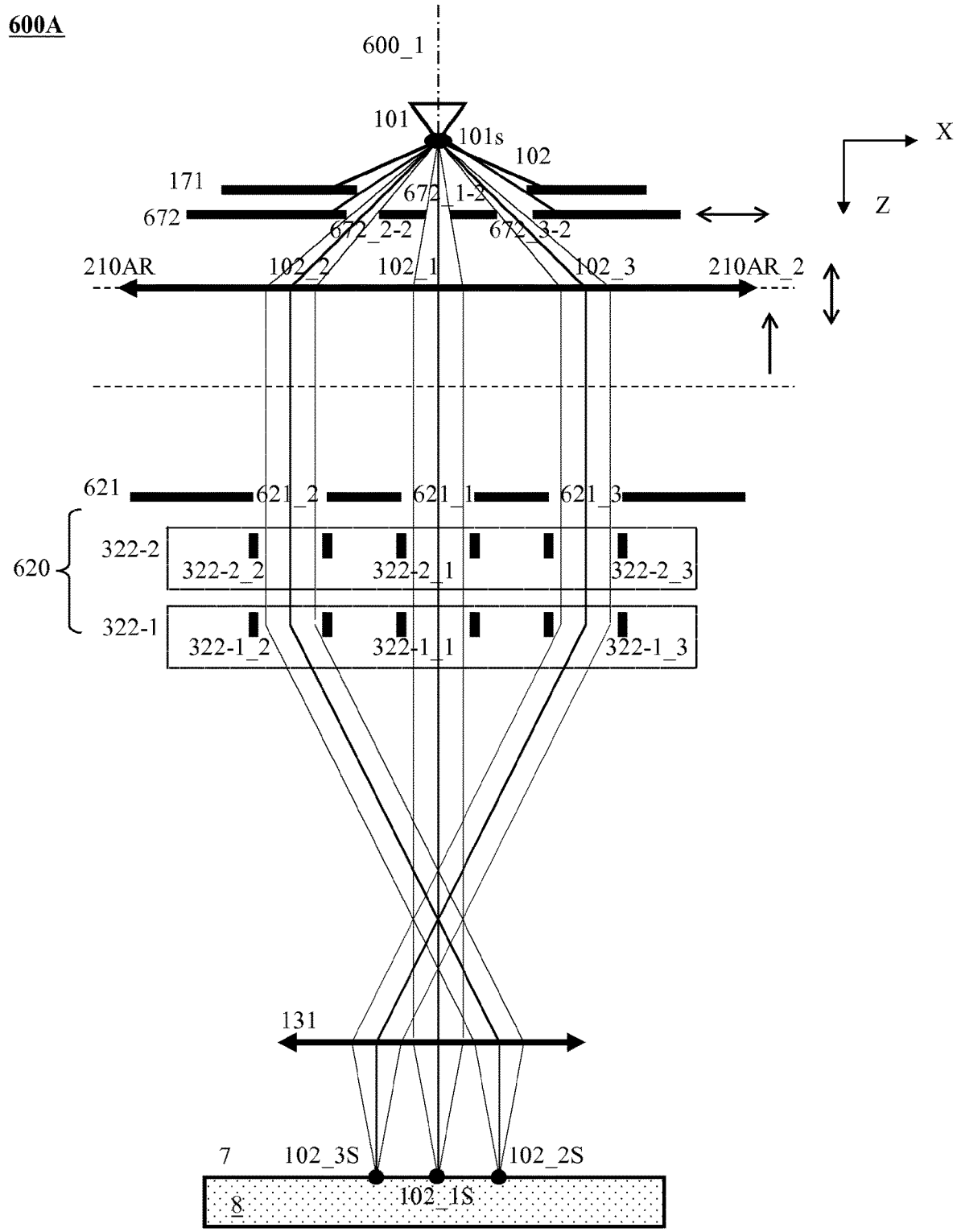

Beamlets 102_1~102_3 in FIG. 11C are focused stronger and earlier than in FIG. 11A. The movable anti-rotation lens 210AR keeps the rotation angles unchanged when different aperture groups are used. Aperture groups therefore can be placed in parallel and pre-beamlet-forming mechanism 672 is not required to rotate when aperture group is changed. No-rotation simplifies the structure of pre-beamlet-forming mechanism 672.

Figure 12A:
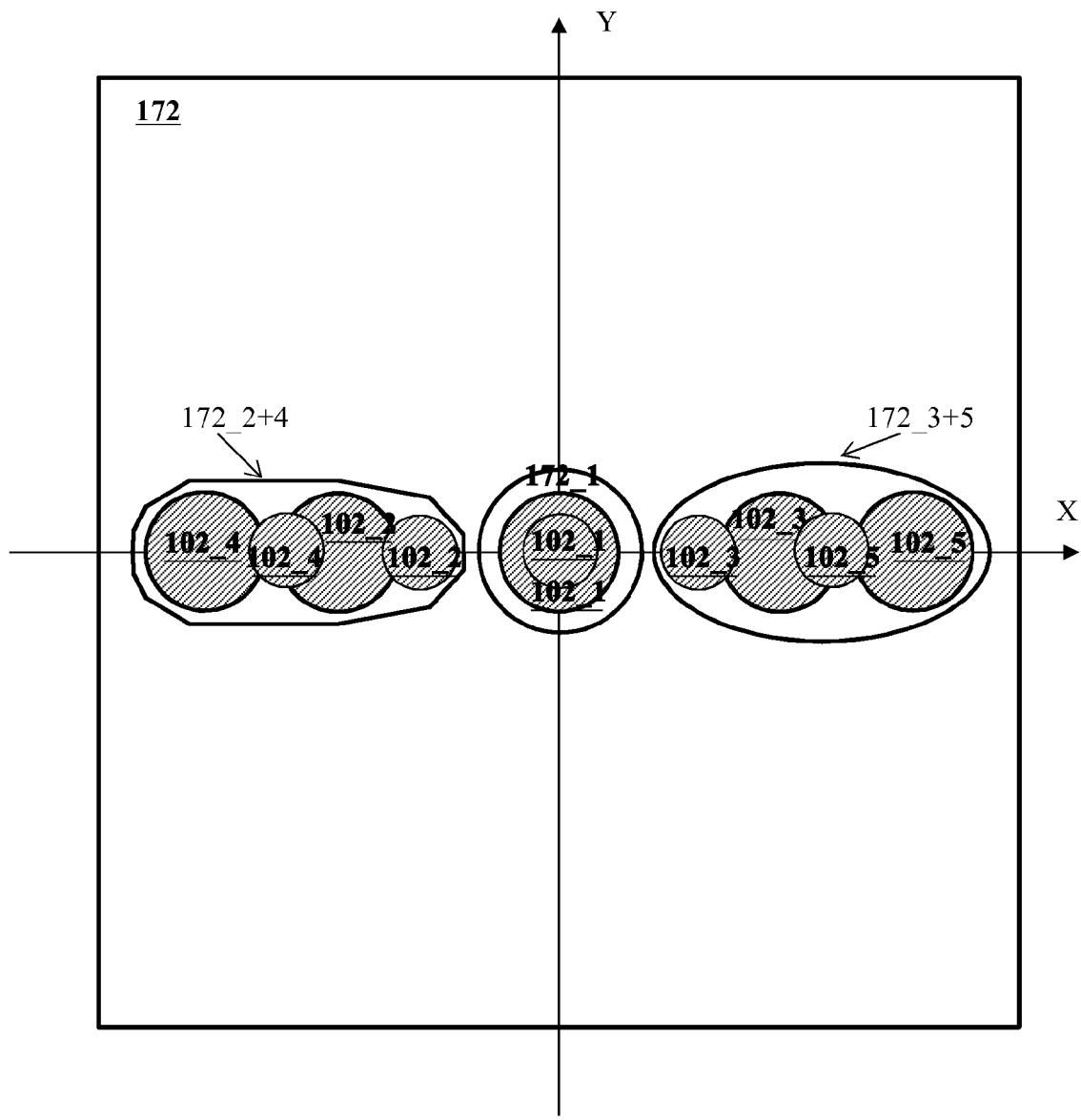
FIGS. 12A and 12B are schematic diagrams each illustrating an exemplary configuration of pre-beamlet-forming mechanism, consistent with embodiments of the present disclosure.
Figure 12B:
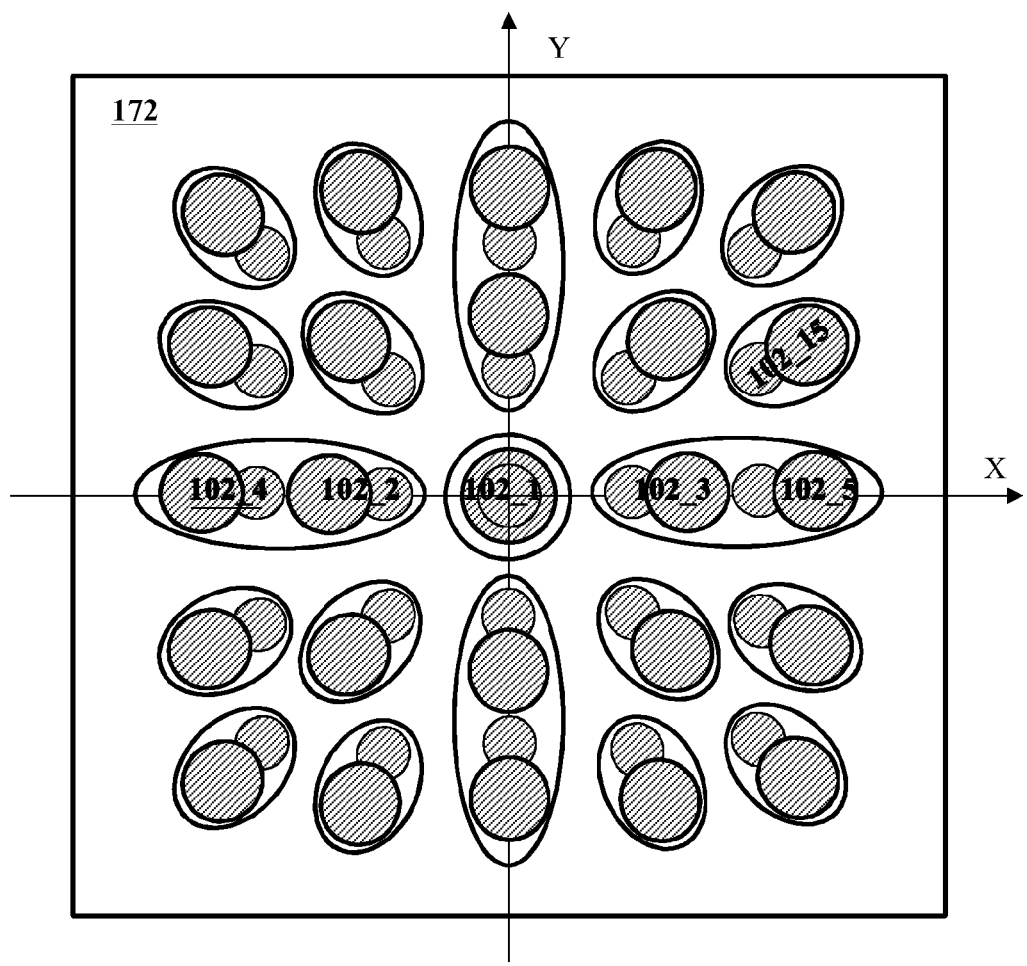

For a multi-beam apparatus, to obtain higher throughput, more beamlets are needed. To make more beamlets available, the beamlet intervals in the source-conversion unit are configured as small as possible. For a multi-beam apparatus, to realize observation or inspection of more kinds of sample, larger variation ranges of the currents of probe spots are needed. Consequently, for a specific variation range of probe currents in a multi-beam apparatus such as the embodiments 300A in FIG. 8A and 500A in FIG. 10, if the beamlet intervals are small to a certain degree, some beamlet-forming apertures of pre-beamlet-forming mechanism 172 may partially overlap as shown in FIGS. 12A-12B. The partially overlapping beamlet-forming apertures can be configured to be one combined beamlet-forming aperture. The beamlets that pass through two adjacent beam-limit openings in the source-conversion unit can pass through this combined beamlet-forming aperture together.

Reference is now made to FIGS. 12A and 12B, which are cross sectional diagrams at X-Y plane of pre-beamlet-forming mechanism (e.g., pre-beamlet-forming mechanism 172 of FIG. 8A), consistent with embodiments of the present disclosure. FIG. 12A shows an example with five beamlets 102_1, 102_2, 102_3, 102_4, and 102_5. Small circle marks of beamlets 102_1~102_5 correspond to beamlets 102_1~102_5 with small probe currents, and large circle marks of beamlets 102_1~102_5 correspond to the beamlets 102_1~102_5 with large probe currents. Beamlets 102_2 and 102_4 pass through combined beamlet-forming aperture 172_2+4, and beamlets 102_3 and 102_5 pass through combined beamlet-forming aperture 172_3+5. Similarly, combined beamlet-forming apertures can be configured into different shapes and sizes to cut off electrons not in use as much as possible. For example, combined beamlet-forming apertures 172_2+4 is in ellipse and combined beamlet-forming apertures 172_3+5 is in polygon. FIG. 12B shows an example with twenty five beamlets. The pre-beamlet-forming mechanism 172 has four combined beamlet-forming apertures and seventeen single beamlet-forming apertures.

Figure 13:
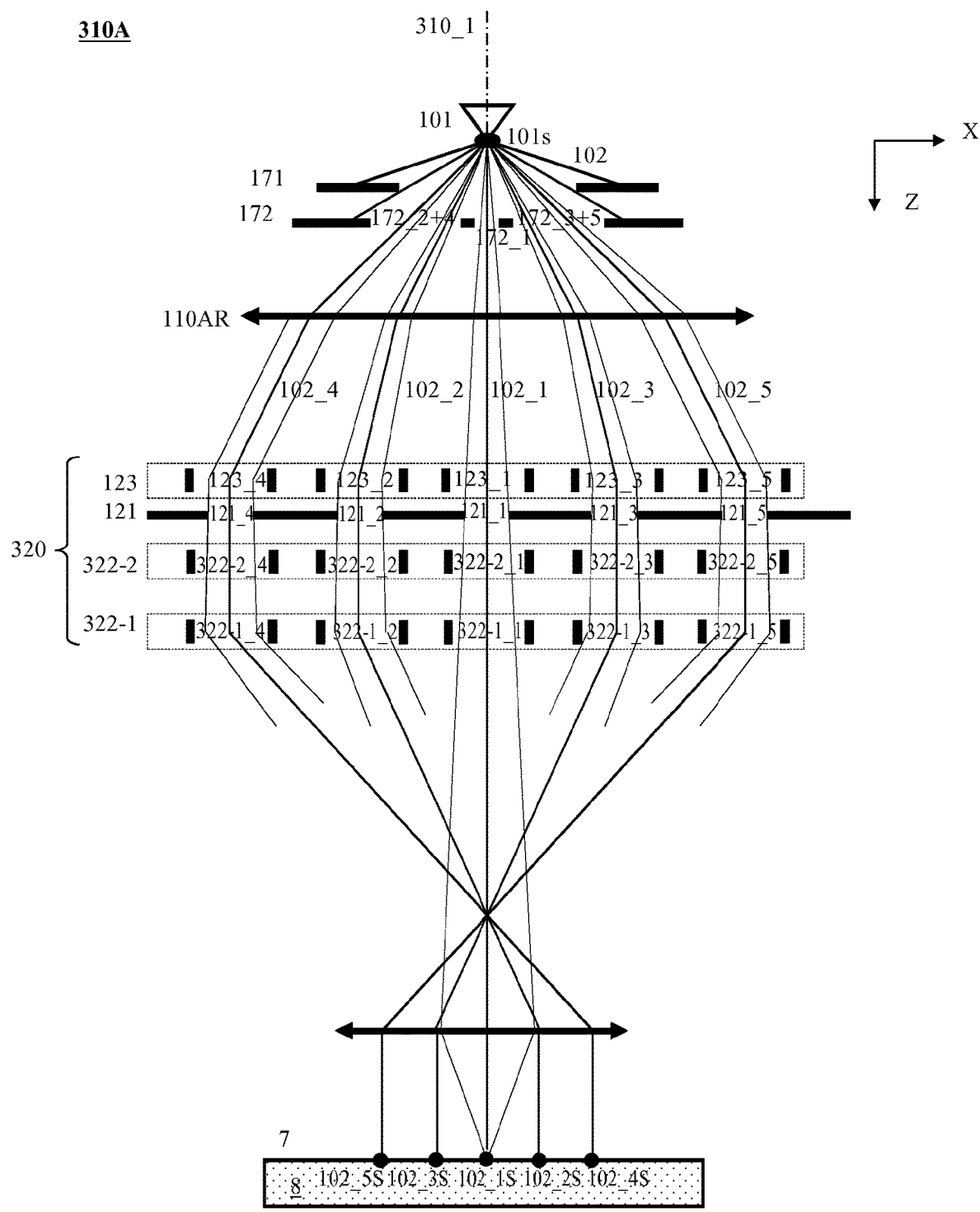
FIG. 13 is a schematic diagram illustrating an exemplary configuration of multi-beam apparatus with a pre-beamlet-forming mechanism of FIG. 12A, consistent with embodiments of the present disclosure.
Figure 14:
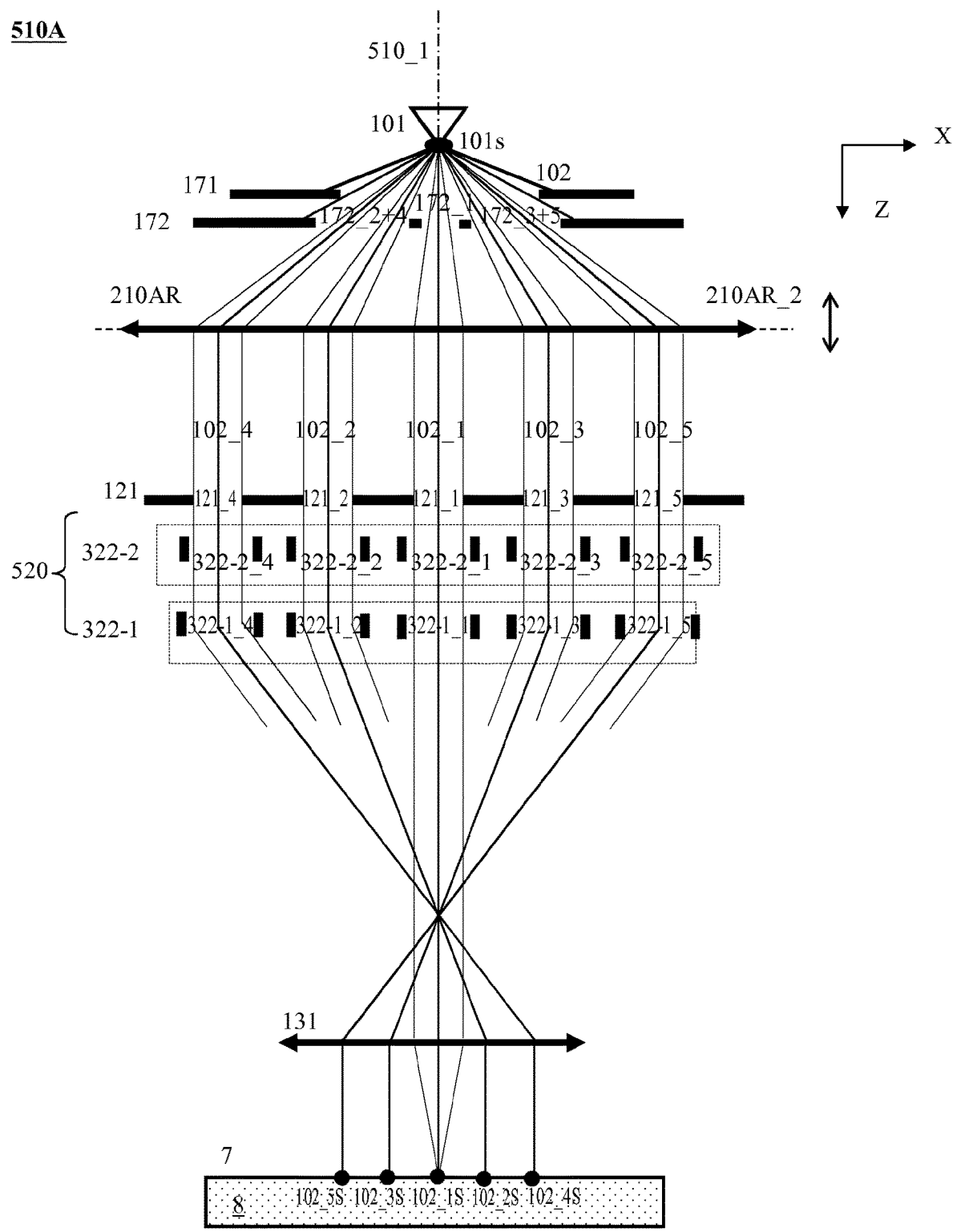
FIG. 14 is a schematic diagram illustrating an exemplary configuration of multi-beam apparatus with a pre-beamlet-forming mechanism of FIG. 12A, consistent with embodiments of the present disclosure.

Reference is now made to FIGS. 13-14, which are schematic diagrams each illustrating an exemplary configuration of multi-beam apparatus with a pre-beamlet-forming mechanism of FIG. 12A, consistent with embodiments of the present disclosure. Configuration of multi-beam apparatus 310A in FIG. 13 is similar to configuration of multi-beam apparatus 300A of FIG. 8A. In multi-beam apparatus 310A of FIG. 13, there are five beamlets 102_1, 102_2, 102_3, 102_4 and 102_5. The pre-beamlet-forming mechanism 172 has three beamlet-forming apertures 172_1, 172_2+4 and 172_3+5, and beamlet-forming apertures 172_2+4 and 172_3+5 are combined beamlet-forming apertures. Center beamlet 102_1 passes through center beamlet-forming aperture 172_1, left two beamlets 102_2 and 102_4 pass through left beamlet-forming aperture 172_2+4 and right two beamlets 102_3 and 102_5 pass through right beamlet-forming aperture 172_3+5.

Configuration of multi-beam apparatus 510A in FIG. 14 is similar to configuration of multi-beam apparatus 500A of FIG. 10A. In configuration of multi-beam apparatus 510A of FIG. 14, there are five beamlets 102_1, 102_2, 102_3, 102_4, and 102_5. Pre-beamlet-forming mechanism 172 has three beamlet-forming apertures 172_1, 172_2+4, and 172_3+5, and beamlet-forming apertures 172_2+4 and 172_3+5 are combined beamlet-forming apertures. Center beamlet 102_1 passes through a center beamlet-forming aperture 172_1, left two beamlets 102_2 and 102_4 pass through left beamlet-forming aperture 172_2+4 and right two beamlets 102_3 and 102_5 pass through right beamlet-forming aperture 172_3+5.

Referring back to FIG. 1A, plural probe spots 102_1S-102_3S for conventional apparatuses are deflected by a common deflection scanning unit to scan the plurality of small scanned region. Hence scanning features (such as scanning direction, scanning range, and scanning speed) of all the beamlets are same. For some sample under observation or inspection, however, the pattern features in different small scanned regions may be very different. To obtain better image contrasts of images generated by the plural probe spots, scanning features of some or all the beamlets need to be different, and are better individually set according to the pattern features in each small scanned region. Each image-forming micro-deflector in one source-conversion unit mentioned above can perform the individual deflection scanning.

Figure 15A:
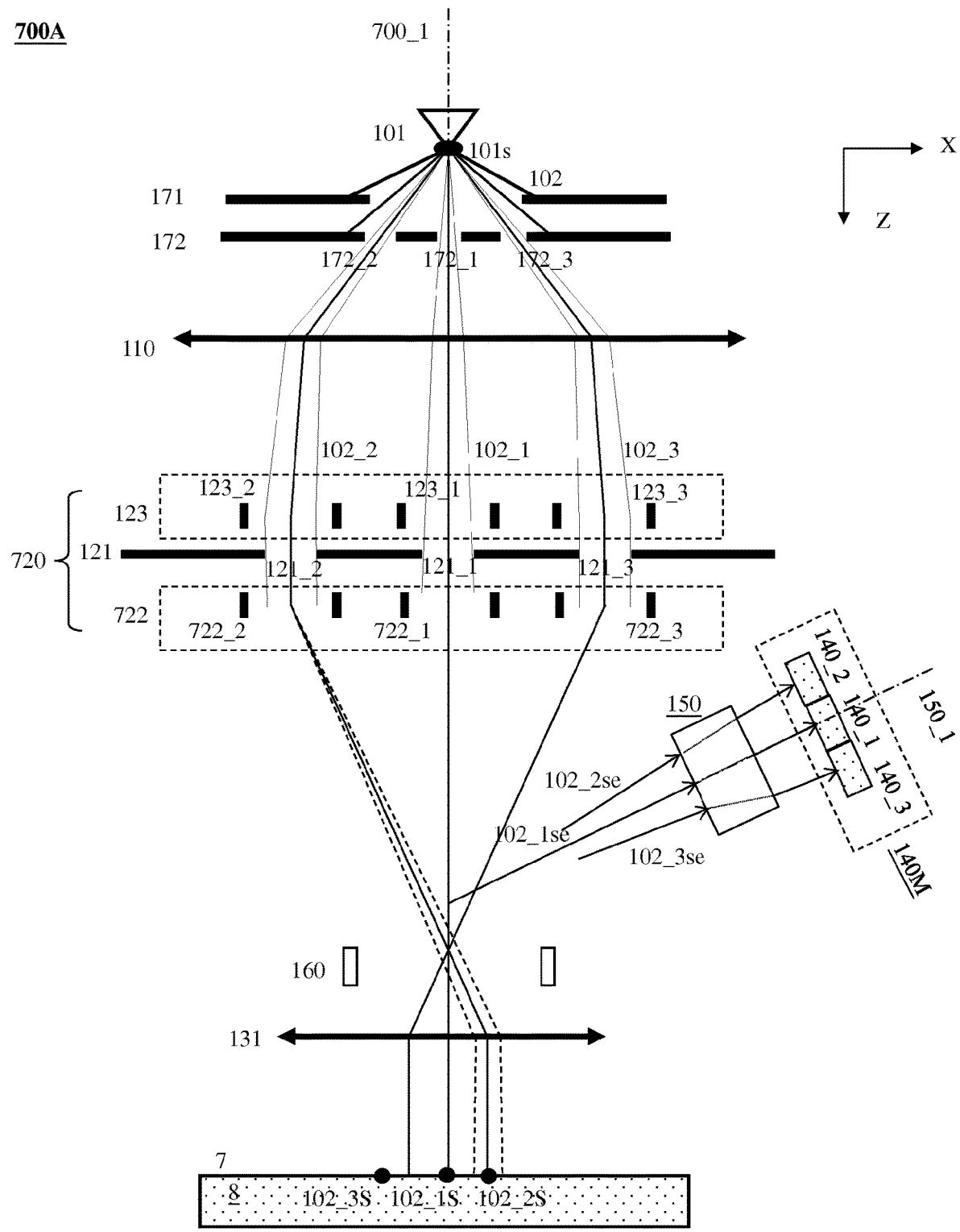
FIG. 15A is a schematic diagram illustrating an exemplary configuration of multi-beam apparatus, consistent with embodiments of the present disclosure.
Figure 15B:
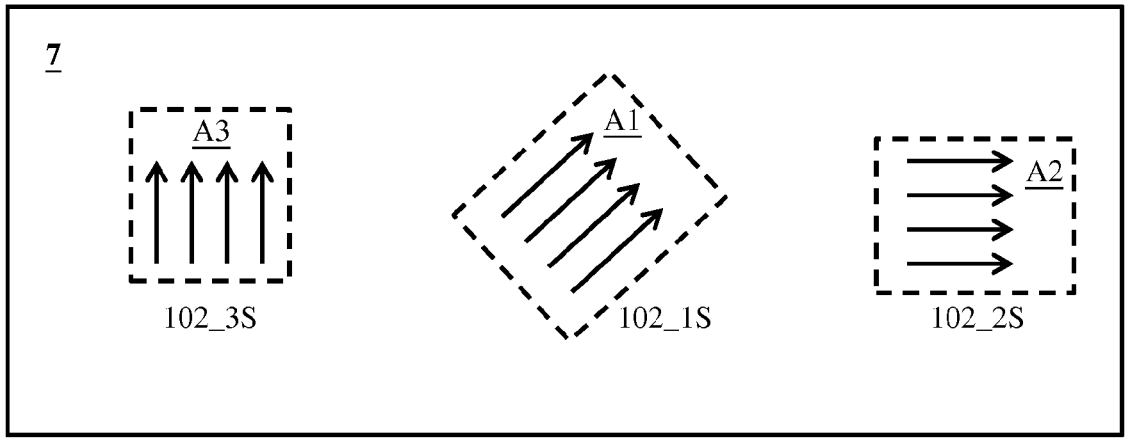
FIG. 15B is a schematic diagram illustrating scanning paths of beamlets on a sample surface of FIG. 15A, consistent with embodiments of the present disclosure.
Figure 15C:
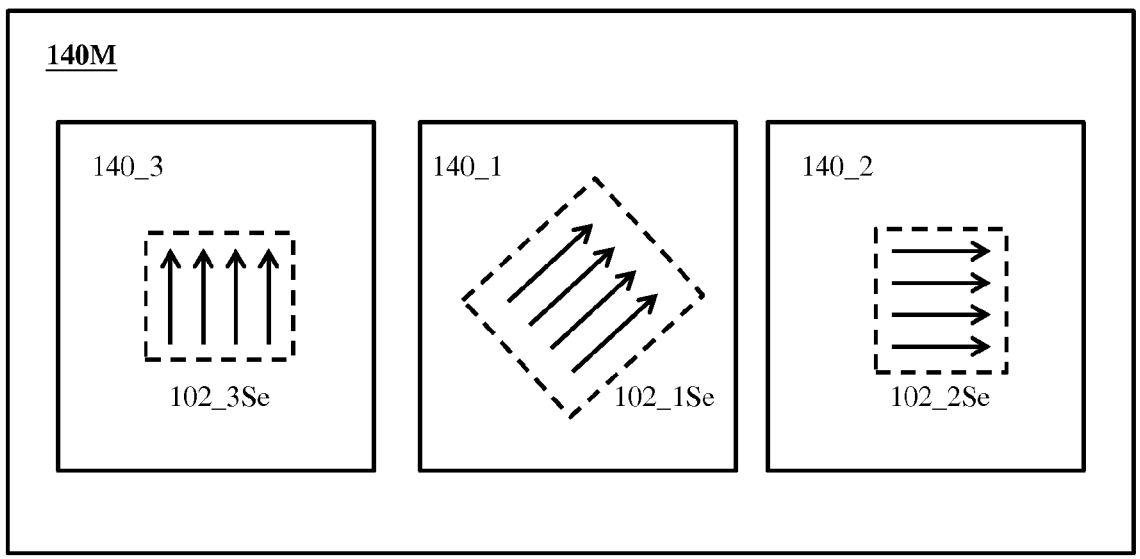
FIG. 15C is a schematic diagram illustrating scanning paths of secondary beams on detection elements of an electron detection device of FIG. 15A, consistent with embodiments of the present disclosure.

Reference is now made to FIGS. 15A-15C, which are schematic diagrams illustrating an exemplary configuration of multi-beam apparatus 700A with individual deflection scanning, consistent with embodiments of the present disclosure. While configuration of multi-beam apparatus 700A in FIG. 15A has some similarties to configuration of multi-beam apparatus 100A in FIG. 1A, multi-beam apparatus 700A further includes an image-forming mechanism 722 of source-conversion unit 720. In FIG. 15A, each image-forming micro-deflector 722_1, 722_2, and 722_3 of image-forming mechanism 722 can deflect one of beamlets 102_1, 102_2, and 102_3 to form a virtual image of electron source 101 and additionally deflect the one beamlet dynamically to scan the corresponding probe spot over a small scanned region. FIG. 15B illustrates exemplary scanning paths of probe spots 102_1S, 102_2S, and 102_3S. Probe spot 102_1S scans the region A1 in dash outline in a direction between X-axis direction and Y-axis direction, probe spot 102_2S scans the region A2 in dash outline in X-axis direction, and probe spot 102_3S scans the region A3 in dash outline in Y-axis direction.

In FIG. 15A, secondary beams or signal beams 102_1se, 102_2se, and 102_3se are generated by probe spots 102_1S-102_3S from the scanned regions A1, A2, and A3. Beam separator 160 deflects secondary beams 102_1se-102_3se to enter secondary projection imaging system 150. Secondary projection imaging system 150 focuses secondary beams 102_1se-102_3se to be detected by detection elements 140_1, 140_2, and 140_3 of an electron detection device 140M. FIG. 15C illustrates exemplary scanning paths of secondary beams 102_1se-102_3se on detection elements 140_1, 140_2, and 140_3. If scanning path of each secondary beam is beyond the corresponding detection element, an anti-scanning deflection unit (not shown in FIG. 15A) placed in front of electron detection device 140M can be used to at least partially cancel motions of secondary beams on detection elements 140_1~140_3.

The embodiments may further be described using the following clauses:

1. An anti-rotation lens having a focusing power for focusing a charged particle beam, comprising:
   a first magnetic lens configured to generate a first magnetic field and to be aligned with an optical axis of the anti-rotation lens; and
   a second magnetic lens configured to generate a second magnetic field and to be aligned with the optical axis, wherein the focusing power of the anti-rotation lens is adjustable by varying the first magnetic field and the second magnetic field, and the first magnetic field and the second magnetic field have opposite directions on the optical axis.

2. The anti-rotation lens of clause 1, wherein the focusing power is adjustable while keeping a rotation angle of the charged particle beam unchanged or substantially unchanged.

3. The anti-rotation lens of clause 2, wherein the rotation angle is zero.

4. An anti-rotation lens having a focusing power for focusing a charged particle beam, comprising:
   a magnetic lens configured to generate a magnetic field and to be aligned with an optical axis of the anti-rotation lens; and
   an electrostatic lens configured to generate an electrostatic field and to be aligned with the optical axis, wherein the magnetic field and the electrostatic field at least partially overlap, and the focusing power of the anti-rotation lens is adjustable by varying the magnetic field and/or the electrostatic field.

5. The anti-rotation lens of clause 5, wherein the focusing power is adjustable while keeping a rotation angle of the charged particle beam unchanged or substantially unchanged.

6. The anti-rotation lens of clause 5, wherein the rotation angle is zero.

7. A movable anti-rotation lens having a focusing power for focusing a charged particle beam, comprising:
   a first magnetic lens configured to generate a first magnetic field and to be aligned with an optical axis of the movable anti-rotation lens;
   a second magnetic lens configured to generate a second magnetic field and to be aligned with the optical axis; and
   a third magnetic lens configured to generate a third magnetic field and to be aligned with the optical axis, wherein the focusing power and a principal plane of the movable anti-rotation lens are adjustable by varying the first magnetic field, the second magnetic field, and/or the third magnetic field, and two of the first magnetic field, the second magnetic field, and the third magnetic field have opposite directions on the optical axis.

8. The movable anti-rotation lens of clause 7, wherein the focusing power and the principal plane are adjustable while keeping a rotation angle of the charged particle beam unchanged or substantially unchanged.

9. The movable anti-rotation lens of clause 8, wherein the rotation angle is zero.

10. A movable anti-rotation lens having a focusing power for focusing a charged particle beam, comprising:
    an anti-rotation lens configured to be aligned with an optical axis of the movable anti-rotation lens; and
    a lens configured to be aligned with the optical axis, wherein the focusing power and a principal plane of the movable anti-rotation lens are adjustable by varying a focusing power of the anti-rotation lens and/or a focusing power of the lens and wherein the principal plane is adjustable with respect to a source generating the charged particle beam.

11. The movable anti-rotation lens of clause 10, wherein the focusing power and the principal plane are adjustable while keeping a rotation angle of the charged particle beam unchanged or substantially unchanged.

12. The movable anti-rotation lens of clause 11, wherein the rotation angle is zero.

13. The movable anti-rotation lens of clause 10, wherein the lens is an electrostatic lens.

14. The movable anti-rotation lens of clause 10, wherein the lens is a magnetic lens.

15. A movable anti-rotation lens having a focusing power for focusing a charged particle beam, comprising:
    a first anti-rotation lens configured to be aligned with an optical axis of the movable anti-rotation lens; and
    a second anti-rotation lens configured to be aligned with the optical axis, wherein the focusing power and a principal plane of the movable anti-rotation lens are adjustable by varying a focusing power of the first anti-rotation lens and/or a focusing power of the second anti-rotation lens.

16. The movable anti-rotation lens of clause 15, wherein the focusing power of the movable anti-rotation lens and the principal plane are adjustable while keeping a rotation angle of the charged particle beam unchanged or substantially unchanged.

17. The movable anti-rotation lens of clause 16, wherein the rotation angle is zero.

18. A multi-beam apparatus for observing a sample, comprising:
    an electron source configured to generate a primary-electron beam;
    a condenser lens configured to focus the primary-electron beam and be one of an anti-rotation lens or a movable anti-rotation lens;
    a source-conversion unit configured to form a plurality of images of the electron source by a plurality of beamlets of the primary-electron beam;
    an objective lens configured to focus the plurality of beamlets onto the surface and form a plurality of probe spots thereon; and
    an electron detection device with a plurality of detection elements configured to detect a plurality of secondary beams generated by the plurality of probe spots from the sample.

19. The multi-beam apparatus of clause 18, further comprising a pre-beamlet-forming mechanism that is between the electron source and the condenser lens and includes multiple beamlet-forming apertures.

20. The multi-beam apparatus of clause 19, wherein the multiple beamlet-forming apertures are configured to trim the primary-electron beam into multiple beamlets.

21. The multi-beam apparatus of clause 20, wherein the condenser lens is configured to focus the multiple beamlets to be incident onto the source-conversion unit with multiple rotation angles.

22. The multi-beam apparatus of clause 21, wherein the multiple rotation angles remain unchanged or substantially unchanged when probe currents of the plurality of probe spots are varied.

23. The multi-beam apparatus of any one of clauses 20 to 22, wherein the multiple beamlets constitute the plurality of beamlets.

24. The multi-beam apparatus of any one of clauses 19 to 23, wherein the probe currents are capable of being changed by varying sizes of multiple beamlet-forming apertures.

25. The multi-beam apparatus of any one of clauses 20, 23, and 24, wherein the source-conversion unit includes a plurality of beam-limit openings configured to trim the multiple beamlets into the plurality of beamlets.

26. The multi-beam apparatus of any one of clauses 18 to 25, wherein the probe currents are capable of being changed by adjusting a focusing power of the condenser lens.

27. The multi-beam apparatus of any one of clauses 19 to 26, wherein the multiple beamlet-forming apertures are configured to cut off electrons not in the plurality of probe spots.

28. The multi-beam apparatus of any one of clauses 18 to 27, wherein the source-conversion unit includes an image-forming mechanism configured to deflect the plurality of beamlets to form the plurality of images.

29. The multi-beam apparatus of clause 28, wherein the image-forming mechanism includes a plurality of electron optics elements configured to deflect the plurality of beamlets to form the plurality of images.

30. The multi-beam apparatus of any one of clauses 28 and 29, wherein deflection angles of the plurality of beamlets are individually set to reduce aberrations of the plurality of probe spots.

31. The multi-beam apparatus of clause 29, wherein the plurality of electron optics elements are configured to compensate off-axis aberrations of the plurality of probe spots.
32. The multi-beam apparatus of any one of clauses 18 to 31, wherein the source-conversion unit includes a beamlet-compensation mechanism configured to compensate off-axis aberrations of the plurality of probe spots.
33. The multi-beam apparatus of clause 32, wherein the plurality of electron optics elements and the beamlet-compensation mechanism together compensate aberrations of the plurality of probe spots.
34. The multi-beam apparatus of clause 29, further comprising a deflection scanning unit, positioned below the source-conversion unit.
35. The multi-beam apparatus of clause 34, wherein the deflection scanning unit is configured to deflect the plurality of beamlets to scan the plurality of probe spots.
36. The multi-beam apparatus of any one of clauses 34 and 35, wherein the plurality of electron optics elements is configured to deflect the plurality of beamlets to scan the plurality of probe spots.
37. The multi-beam apparatus of any one of clauses 34 and 35, wherein the deflection scanning unit and the plurality of electron optics elements are configured to together deflect the plurality of beamlets to scan the plurality of probe spots.
38. The multi-beam apparatus of clause 29, wherein the plurality of electron optics elements are configured to deflect the plurality of beamlets to scan the plurality of probe spots.
39. The multi-beam apparatus of one of clauses 36 to 38, wherein one or more of the plurality of probe spots can be different in one or more scanning features.
40. The multi-beam apparatus of clause 39, wherein the one of the scanning features include scanning direction.
41. The multi-beam apparatus of clause 39, wherein the one of the scanning features include scanning size.
42. The multi-beam apparatus of clause 39, wherein the one of the scanning features include scanning speed.
43. The multi-beam apparatus of one of clauses 36 to 39, further comprising an anti-scanning deflection unit placed in front of the electron detection device and configured to deflect the plurality of secondary beams to the plurality of detection elements.
44. A method to configure an anti-rotation lens for focusing a charge particle beam, the method comprising:
    generating a first magnetic field by a first magnetic lens that is aligned with an optical axis of the anti-rotation lens;
    generating a second magnetic field by a second magnetic lens this is aligned with the optical axis; and
    generating a focusing power of the anti-rotation lens by the first magnetic field and the second magnetic field, wherein the first magnetic field and the second magnetic field have opposite directions on the optical axis.
45. The method of clause 44, further comprising changing the focusing power by adjusting the first magnetic field and the second magnetic field while keeping a rotation angle of the charged particle beam unchanged or substantially unchanged.
46. A method to configure an anti-rotation lens for focusing a charge particle beam, the method comprising:
    generating a magnetic field by a magnetic lens;
    generating an electrostatic field by an electrostatic lens; and
    generating a focusing power of the anti-rotation lens by the magnetic field and/or the electrostatic field, wherein the magnetic field and the electrostatic field at least partially overlap.
47. The method of clause 46, further comprising changing the focusing power by adjusting the magnetic field and/or the electrostatic field while keeping a rotation angle of the charged particle beam unchanged or substantially unchanged.
48. A method to configure a movable anti-rotation lens for focusing a charge particle beam, the method comprising:
    generating a first magnetic field by a first magnetic lens that is aligned with an optical axis of the movable anti-rotation lens;
    generating a second magnetic field by a second magnetic lens that is aligned with the optical axis;
    generating a third magnetic field by a third magnetic lens that is aligned with the optical axis; and
    generating a focusing power of the movable anti-rotation lens by the first magnetic field, the second magnetic field, and/or the third magnetic field, wherein two of the first magnetic field, the second magnetic field, and the third magnetic field have opposite directions on the optical axis.
49. The method of clause 48, further comprising changing the focusing power and moving a principal plane of the movable anti-rotation lens by adjusting the first magnetic field, the second magnetic field, and/or the third magnetic field while keeping a rotation angle of the charged particle beam unchanged or substantially unchanged.
50. A method to configure a multi-beam apparatus for observing a sample, the method comprising:
    trimming a primary-electron beam from an electron source into multiple beamlets by a pre-beamlet forming mechanism that is positioned between the electron source and a condenser lens;
    forming a plurality of images of the electron source using the multiple beamlets by a source-conversion unit;
    forming a plurality of probe spots on the sample by projecting the plurality of images onto the sample; and
    adjusting the condenser lens to keep rotation angles of the multiple beamlets unchanged or substantially unchanged when changing probe currents of the plurality of probe spots, wherein the condenser lens is one of an anti-rotation lens or a movable anti-rotation lens.
51. The method of clause 50, further comprising adjusting the source-conversion unit to scan the plurality of probe spots on the sample.
52. A non-transitory computer readable medium storing a set of instructions that is executable by one or more processors of a multi-beam apparatus to cause the multi-beam apparatus to perform a method to configure an anti-rotation lens for focusing a charge particle beam, the method comprising:
    instructing a first magnetic lens to generate a first magnetic field, wherein the first magnetic lens is aligned with an optical axis of the anti-rotation lens; and instructing a second magnetic lens to generate a second magnetic field, wherein the second magnetic lens is aligned with the optical axis, wherein:
the first magnetic field and the second magnetic field generate a focusing power of the anti-rotation lens, and
the first magnetic field and the second magnetic field have opposite directions on the optical axis.

53. The non-transitory computer readable medium of clause 52, wherein the set of instructions that is executable by the one or more processors of the multi-beam apparatus to cause the multi-beam apparatus to further perform:
adjusting the first magnetic field and the second magnetic field to adjust the focusing power, while keeping a rotation angle of the charged particle beam unchanged or substantially unchanged.

54. A non-transitory computer readable medium storing a set of instructions that is executable by one or more processors of a multi-beam apparatus to cause the multi-beam apparatus to perform a method to configure an anti-rotation lens for focusing a charge particle beam, the method comprising:
instructing a magnetic lens to generate a magnetic field; and
instructing an electrostatic lens to generate an electrostatic field, wherein:
the magnetic field and/or the electrostatic field generate a focusing power of the anti-rotation lens, and
the magnetic field and the electrostatic field at least partially overlap.

55. The non-transitory computer readable medium of clause 54, wherein the set of instructions that is executable by the one or more processors of the multi-beam apparatus to cause the multi-beam apparatus to further perform:

56. adjusting the magnetic field and/or the electrostatic field to change the focusing power while keeping a rotation angle of the charged particle beam unchanged or substantially unchanged.

57. A non-transitory computer readable medium storing a set of instructions that is executable by one or more processors of a multi-beam apparatus to cause the multi-beam apparatus to perform a method to configure a movable anti-rotation lens for focusing a charge particle beam, the method comprising:
instructing a first magnetic lens to generate a first magnetic field, wherein the first magnetic lens is aligned with an optical axis of the movable anti-rotation lens;
instructing a second magnetic lens to generate a second magnetic field, wherein the second magnetic lens is aligned with the optical axis; and
instructing a third magnetic lens to generate a third magnetic field, wherein the third magnetic lens that is aligned with the optical axis; wherein
the first magnetic field, the second magnetic field, and/or the third magnetic field generate a focusing power of the movable anti-rotation lens, and
two of the first magnetic field, the second magnetic field, and the third magnetic field have opposite directions on the optical axis.

58. The non-transitory computer readable medium of clause 57, wherein the set of instructions that is executable by the one or more processors of the multi-beam apparatus to cause the multi-beam apparatus to further perform:
adjusting the first magnetic field, the second magnetic field, and/or the third magnetic field to change the focusing power and to move a principal plane of the movable anti-rotation lens while keeping a rotation angle of the charged particle beam unchanged or substantially unchanged.

It is appreciated that a controller of the multi-beam apparatus could use software to control the functionality described above. For example, the controller could send instructions to the aforementioned lenses to generate an appropriate field (e.g., magnetic or electrostatic field). The software could be stored on a non-transitory computer readable medium. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

Although the present invention has been explained in relation to its preferred embodiments, it is to be understood that other modifications and variation can be made without departing the spirit and scope of the invention as hereafter claimed.

What is claimed is:

1. An anti-rotation lens having a focusing power for focusing a charged particle beam, comprising:
a first magnetic lens configured to generate a first magnetic field being aligned with an optical axis of the anti-rotation lens; and
a second magnetic lens configured to generate a second magnetic field being aligned with the optical axis, wherein the focusing power of the anti-rotation lens is adjustable by varying the first magnetic field and the second magnetic field, and the first magnetic field and the second magnetic field have opposite directions on the optical axis.

2. The anti-rotation lens of claim 1, wherein the focusing power is adjustable while keeping a rotation angle of the charged particle beam unchanged or substantially unchanged.

3. The anti-rotation lens of claim 2, wherein the rotation angle is zero.

4. The anti-rotation lens of claim 1, wherein the anti-rotation lens comprises a third magnetic lens configured to generate a third magnetic field aligned with the optical axis, the focusing power and a principal plane of the anti-rotation lens are adjustable by varying the first magnetic field, the second magnetic field, and/or the third magnetic field, and two of the first magnetic field, the second magnetic field, and the third magnetic field have opposite directions on the optical axis.

5. The anti-rotation lens of claim 4, wherein the focusing power and the principal plane are adjustable while keeping a rotation angle of the charged particle beam unchanged or substantially unchanged.

6. A multi-beam apparatus, comprising:
an electron source configured to generate a primary-electron beam;
a condenser lens configured to focus the primary-electron beam;

a source-conversion unit configured to form a plurality of images of the electron source by a plurality of beamlets of the primary-electron beam; and an objective lens configured to focus the plurality of beamlets onto the surface and form a plurality of probe spots thereon;

wherein the multibeam apparatus further comprises an anti-rotation lens according to claim 1.

7. The multi-beam apparatus of claim 6, further comprising an electron detection device having a plurality of detection elements configured to detect a plurality of secondary beams generated by the plurality of probe spots from the sample for observing the sample.

8. A method to configure an anti-rotation lens for focusing a charge particle beam, the method comprising:

generating a first magnetic field by a first magnetic lens that is aligned with an optical axis of the anti-rotation lens;

generating a second magnetic field by a second magnetic lens that is aligned with the optical axis; and generating a focusing power of the anti-rotation lens by the first magnetic field and the second magnetic field, wherein the first magnetic field and the second magnetic field have opposite directions on the optical axis;

wherein the method further comprises adjusting the focusing power by adjusting the first magnetic field and the second magnetic field while keeping a rotation angle of the charged particle beam unchanged or substantially unchanged.

9. The anti-rotation lens of claim 1, wherein a ratio between an amplitude of the first magnetic field and an amplitude of the second magnetic field is one.

10. The anti-rotation lens of claim 1, wherein a distribution of the first magnetic field and the second magnetic field is substantially similar.

11. The anti-rotation lens of claim 2, wherein the rotation angle of the charged-particle beam is based on an interaction between a charged-particle source configured to generate the charged-particle beam and the first and the second magnetic fields.

* * * * *